(12) United States Patent
Hayakawa et al.

(10) Patent No.: US 9,524,742 B2
(45) Date of Patent: Dec. 20, 2016

(54) $C_xN_yH_z$ FILM, DEPOSITION METHOD, MAGNETIC RECORDING MEDIUM AND METHOD FOR MANUFACTURING THE SAME

(75) Inventors: Haruhito Hayakawa, Chiba (JP); Kouji Abe, Chiba (JP); Keiichi Terashima, Chiba (JP); Yuuji Honda, Chiba (JP)

(73) Assignee: YOUTEC CO., LTD., Chiba (JP)

( * ) Notice: Subject to any disclaimer, the term of this patent is extended or adjusted under 35 U.S.C. 154(b) by 0 days.

(21) Appl. No.: 14/351,661

(22) PCT Filed: Oct. 24, 2011

(86) PCT No.: PCT/JP2011/074457
§ 371 (c)(1),
(2), (4) Date: Jul. 9, 2014

(87) PCT Pub. No.: WO2013/061398
PCT Pub. Date: May 2, 2013

(65) Prior Publication Data
US 2014/0349140 A1    Nov. 27, 2014

(51) Int. Cl.
*G11B 5/66*    (2006.01)
*G11B 5/72*    (2006.01)
(Continued)

(52) U.S. Cl.
CPC ........... *G11B 5/722* (2013.01); *C23C 16/0272* (2013.01); *C23C 16/347* (2013.01); *C23C 16/56* (2013.01);
(Continued)

(58) Field of Classification Search
CPC ........... G11B 5/72; G11B 5/722; G11B 5/725; G11B 5/8408; C23C 16/0272; C23C 16/56; C23C 16/347
See application file for complete search history.

(56) References Cited

U.S. PATENT DOCUMENTS 6,875,492 B1* 4/2005 Pirzada et al. ............. 428/833.2
2001/0031382 A1* 10/2001 Kusakawa et al. ...... 428/694 TC
(Continued)

FOREIGN PATENT DOCUMENTS

JP    07-006354    1/1995
JP    09-125229    5/1997
(Continued)

OTHER PUBLICATIONS

Gruger et al., "Deposition of CNx thin films by plasma-activated chemical vapour deposition using various precursors as carbon source," J Matl Sci, vol. 32(11), Dec. 1997, pp. 2849-2853.*
(Continued)

*Primary Examiner* — Holly Rickman
(74) *Attorney, Agent, or Firm* — Wenderoth, Lind & Ponack, L.L.P.

(57) ABSTRACT

To provide a $C_xN_yH_z$ film of high density and a deposition method. One aspect of the present invention is a $C_xN_yH_z$ film formed on a substrate to be deposited, wherein x, y and z satisfy formulae (1) to (4) below:

$$0.4<x<0.7 \quad (1)$$

$$0.01<y<0.5 \quad (2)$$

$$0\leq z<0.3 \quad (3)$$

$$x+y+z=1. \quad (4)$$

17 Claims, 14 Drawing Sheets

(51) Int. Cl.
    *G11B 5/84*    (2006.01)
    *C23C 16/02*   (2006.01)
    *C23C 16/34*   (2006.01)
    *C23C 16/56*   (2006.01)
    *G11B 5/725*   (2006.01)

(52) U.S. Cl.
    CPC ............... *G11B 5/72* (2013.01); *G11B 5/725* (2013.01); *G11B 5/8408* (2013.01)

(56) References Cited

U.S. PATENT DOCUMENTS

| | | | |
|---|---|---|---|
| 2009/0169968 A1* | 7/2009 | Iseki et al. | 429/34 |
| 2009/0317663 A1* | 12/2009 | Kong et al. | 428/833.3 |
| 2010/0009216 A1* | 1/2010 | Liu et al. | 428/800 |
| 2010/0093187 A1* | 4/2010 | Lee et al. | 438/780 |
| 2010/0261039 A1* | 10/2010 | Itoh et al. | 428/800 |
| 2011/0244142 A1* | 10/2011 | Cheng et al. | 427/569 |

FOREIGN PATENT DOCUMENTS

| | | |
|---|---|---|
| JP | 3058066 | 7/2000 |
| JP | 2001-277249 | 10/2001 |
| JP | 2002-038269 | 2/2002 |
| JP | 2002-230739 | 8/2002 |
| JP | 2004-277882 | 10/2004 |
| JP | 2009-185316 | 8/2009 |
| JP | 2010-062457 | 3/2010 |
| JP | 2010-238359 | 10/2010 |

OTHER PUBLICATIONS

International Search Report issued Jan. 31, 2012 in International (PCT) Application No. PCT/JP2011/074457.

\* cited by examiner

FILM, DEPOSITION METHOD, MAGNETIC RECORDING MEDIUM AND METHOD FOR MANUFACTURING THE SAME

TECHNICAL FIELD

The present invention relates to a $C_xN_yH_z$ film, a deposition method, a magnetic recording medium and a method for manufacturing the same.

BACKGROUND ART

FIG. 18 is a cross-sectional view for explaining a method for manufacturing a conventional magnetic recording medium.

First, there is prepared a substrate to be deposited 100 in which at least a magnetic layer 102 is formed on a nonmagnetic substrate 101, and on the substrate to be deposited 100, a DLC (Diamond Like Carbon) film 103 having a thickness of 3 nm is deposited by a plasma CVD (chemical vapor deposition) method. Next, on the DLC film 103, a CN film 104 having a thickness of 1 nm is formed by sputtering.

Subsequently, by dipping the CN film 104 in a fluorine-based Fomblin oil, the Fomblin oil is coated on the CN film 104. Next, the substrate to be deposited 100 is annealed at 150° C. for 1 hour, and thus a fluorinated organic film 105 having a thickness of 4 nm that functions as a solid lubricant is formed on the CN film 104. In addition, as a method for producing the fluorinated organic film 105, an evaporation method is also used in some cases and the evaporation temperature in that case is 110° C.

When the magnetic recording medium is to be used, it is necessary to bring a media head (not illustrated) close to the fluorinated organic film 105, and the distance between the media head and the magnetic layer 102 is required to be shorter. Consequently, the total thickness of the DLC film 103, the CN film 104 and the fluorinated organic film 105 is required to be smaller.

Furthermore, the reason why the DLC film 103 is deposited by a plasma CVD method in the magnetic recording medium is as follows.

When a DLC film is formed by sputtering and the thickness is set to be 8 nm or less, there is generated a problem in which impurities such as Co are eluted from the magnetic layer 102 and the resultant impurities reach the fluorinated organic film 105 (so-called corrosion). Therefore, by depositing a DLC film by a plasma CVD method, a DLC film having a higher density than in the case of sputtering can be deposited, and thus, even when the thickness is set to be 3 nm, barrier properties for preventing corrosion can be sufficiently secured.

Furthermore, the reason why the CN film 104 is formed in the magnetic recording medium is as follows.

Since the contact angle of water with the DLC film 103 is about 80°, when the fluorinated organic film 105 is coated on the DLC film 103, the adhesion between the DLC film 103 and the fluorinated organic film 105 is poor. Consequently, the fluorinated organic film 105 cannot be coated on the DLC film 103. Therefore, by forming the CN film 104, with which the contact angle of water is about 30°, between the DLC film 103 and the fluorinated organic film 105, the adhesion between the DLC film 103 and the fluorinated organic film 105 can be enhanced. However, the CN film 104 does not have a barrier function for preventing the corrosion.

DISCLOSURE OF THE INVENTION

Problem to be Solved by the Invention

One aspect of the present invention has an object of providing a $C_xN_yH_z$ film of high density and a deposition method thereof.

One aspect of the present invention has an object of providing a magnetic recording medium having a film with a small thickness between a magnetic layer and a fluorinated organic film, or a method for manufacturing the same.

Means for Solving the Problem

One aspect of the present invention is a $C_xN_yH_z$ film deposited on a substrate to be deposited, wherein x, y and z satisfy formulae (1) to (4) below:

$$0.4 < x < 0.7 \tag{1}$$

$$0.01 < y < 0.5 \tag{2}$$

$$0 \le z < 0.3 \tag{3}$$

$$x + y + z = 1. \tag{4}$$

In addition, in one aspect of the present invention, the $C_xN_yH_z$ film preferably has a surface with which the contact angle of water is 50° or less (more preferably 30° or less).

One aspect of the present invention is a magnetic recording medium including:
a magnetic layer formed on a nonmagnetic substrate;
the above-mentioned $C_xN_yH_z$ film formed on the magnetic layer; and
a fluorinated organic film formed on the $C_xN_yH_z$ film.

Furthermore, in one aspect of the present invention, it is suitable to further include a DLC film formed between the $C_xN_yH_z$ film and the magnetic layer.

Moreover, in one aspect of the present invention, the fluorinated organic film is any film of a $C_aF_b$ film, a $C_aF_bN_c$ film, a $C_aF_bH_d$ film, a $C_aF_bO_e$ film, a $C_aF_bO_eH_d$ film, a $C_aF_bN_cO_e$ film and a $C_aF_bN_cO_eH_d$ film, where a, b, c, d and e are natural numbers.

In addition, in one aspect of the present invention, each of the $C_aF_b$ film, the $C_aF_bN_c$ film, the $C_aF_bH_d$ film, the $C_aF_bO_e$ film, the $C_aF_bO_eH_d$ film, the $C_aF_bN_cO_e$ film and the $C_aF_bN_cO_eH_d$ film is an amorphous film, where a, b, c, d and e are natural numbers.

Furthermore, in one aspect of the present invention, any of the films has a thickness of 3 nm or less.

One aspect of the present invention is a deposition method of the above $C_xN_yH_z$ film, on a substrate to be deposited, by a CVD method using a gas of a vaporized starting material wherein:
the starting material contains $C_XH_YN_Z$, is a liquid or a solid at ordinary temperature and satisfies formulae (1) to (4) below, where
X, Y and Z are natural numbers, $$4 \le X \le 12 \tag{1}$$

$$0 \le Y \le 4 \tag{2}$$

$$2 \le Z \le 12 \tag{3}$$

$$Y/X < 1. \tag{4}$$

Here, the starting material means a compound containing constituent elements of a thin film.

In addition, in one aspect of the present invention, the starting material is a raw material of any one of $C_4H_2N_2$, $C_5H_3N_3$, $C_7H_3N_3$, $C_6H_2N_4$, $C_5H_2N_4$, $C_{10}H_2N_4$, $C_{12}H_4N_4$ and $C_6N_4$.

One aspect of the present invention is a method for manufacturing a magnetic recording medium, forming a fluorinated organic film on the $C_xN_yH_z$ film deposited by the above deposition method, wherein the substrate to be deposited has a magnetic layer formed on a nonmagnetic substrate; and wherein the $C_xN_yH_z$ film has a surface with which the contact angle of water is 50° or less.

Furthermore, in one aspect of the present invention, a DLC film is formed between the $C_xN_yH_z$ film and the magnetic layer.

Moreover, in one aspect of the present invention, the fluorinated organic film is any film of a $C_aF_b$ film, a $C_aF_bN_c$ film, a $C_aF_bH_d$ film, a $C_aF_bO_e$ film, a $C_aF_bO_eH_d$ film, a $C_aF_bN_cO_e$ film and a $C_aF_bN_cO_eH_d$ film formed by a CVD method using a raw material gas;

wherein the raw material gas has an organic raw material gas containing carbon and fluorine, where a, b, c, d and e are natural numbers.

In addition, in one aspect of the present invention, the organic raw material gas contains three or more carbons.

Furthermore, in one aspect of the present invention, the organic raw material gas when forming the $C_aF_b$ film on the film has at least one of $C_3F_6$, $C_4F_6$, $C_6F_6$, $C_6F_{12}$, $C_6F_{14}$, $C_7F_8$, $C_7F_{14}$, $C_7F_{16}$, $C_8F_{16}$, $C_8F_{18}$, $C_9F_{18}$, $C_9F_{20}$, $C_{10}F_8$, $C_{10}F_{18}$, $C_{11}F_{20}$, $C_{12}F_{10}$, $C_{13}F_{28}$, $C_{15}F_{32}$, $C_{20}F_{42}$, and $C_{24}F_{50}$;

wherein the organic raw material gas when forming the $C_aF_bN_c$ film on the film has at least one of $C_3F_3N_3$, $C_3F_9N$, $C_5F_5N$, $C_6F_4N_2$, $C_6F_9N_3$, $C_6F_{12}N_2$, $C_6F_{15}N$, $C_7F_5N$, $C_8F_4N_2$, $C_9F_{21}N$, $C_{12}F_4N_4$, $C_{12}F_{27}N$, $C_{14}F_8N_2$, $C_{15}F_{33}N$, $C_{24}F_{45}N_3$, and tri(heptafluoropropyl)amine;

wherein the organic raw material gas when forming the $C_aF_bO_d$ film on the film has at least one of $C_3F_6O$, $C_4F_6O_3$, $C_4F_8O$, $C_5F_6O_3$, $C_6F_4O_2$, $C_6F_{10}O_3$, $C_8F_4O_3$, $C_8F_8O$, $C_8F_8O_2$, $C_8F_{14}O_3$, $C_{13}F_{10}O$, $C_{13}F_{10}O_3$, and $C_2F_6O(C_3F_6O)_n(CF_2O)_m$; and wherein the organic raw material gas when forming the $C_aF_bN_cO_d$ film on the film has $C_7F_5NO$.

In addition, in one aspect of the present invention, perfluoroamines are used as the organic raw material gas.

Furthermore, in one aspect of the present invention, the CVD method using the raw material gas is a plasma CVD method of holding the $C_xN_yH_z$ film by a holding electrode, disposing a counter electrode facing the $C_xN_yH_z$ film held by the holding electrode, and setting, to be +150 V to −150 V, a direct-current voltage in forming direct-current plasma or a direct-current voltage component in forming high-frequency plasma, by supplying electric power to one of the holding electrode and the counter electrode.

Effect of the Invention

According to one aspect of the present invention, a $C_xN_yH_z$ film of high density and a deposition method can be provided.

Furthermore, according to one aspect of the present invention, a magnetic recording medium having a film with a small thickness between a magnetic layer and a fluorinated organic film, or a method for manufacturing the same can be provided.

BEST MODE FOR CARRYING OUT THE INVENTION

Hereinafter, embodiments of the present invention will be explained in detail using the drawings. However, a person skilled in the art will understand easily that the present invention is not limited to the explanation below, but that forms and details thereof can be modified variously without departing from the purport of the present invention and the range thereof. Accordingly, the present invention should not be construed as being limited to the described contents of embodiments shown below.

First Embodiment

Figure 1:
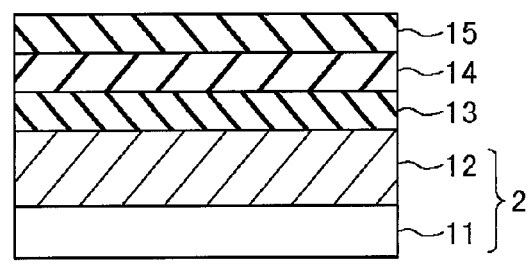
FIG. 1 is a cross-sectional view for explaining a method for manufacturing the magnetic recording medium according to one aspect of the present invention.
Figure 2:
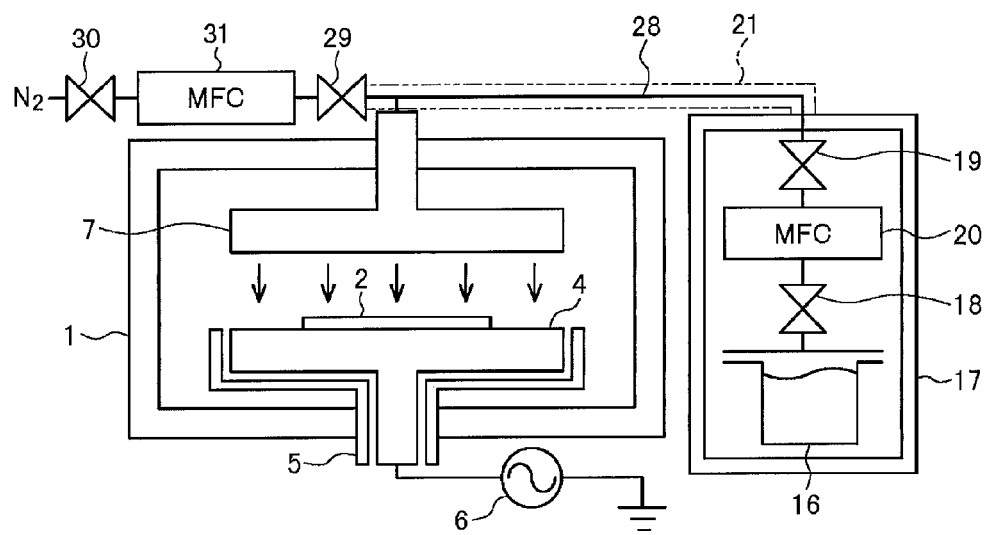
FIG. 2 is a cross-sectional view showing schematically a CVD apparatus for depositing a $C_xN_yH_z$ film 13 shown in FIG. 1.

FIG. 1 is a cross-sectional view for explaining a method for manufacturing the magnetic recording medium according to one aspect of the present invention. FIG. 2 is a cross-sectional view showing schematically a CVD apparatus for depositing a $C_xN_yH_z$ film 14 shown in FIG. 1.

First, as shown in FIG. 1, there is prepared a substrate to be deposited 2 in which at least a magnetic layer 12 is formed on a nonmagnetic substrate 11, and on the substrate to be deposited 2, a DLC film 13 having a thickness of 1 nm (preferably 0.5 nm) is deposited by a CVD method. Meanwhile, the substrate to be deposited 2 is, for example, a hard disc substrate, a media head or the like.

Next, on the DLC film 13, the $C_xN_yH_z$ film 14 having a thickness of 1 nm (preferably 0.5 nm) is deposited using the CVD apparatus shown in FIG. 2. The contact angle of water with the surface of the $C_xN_yH_z$ film 14 becomes 50° or less (preferably 30° or less). x, y and z satisfy formulae (1) to (4) below, preferably satisfy formulae (1') to (4') below.

$$0.4 < x < 0.7 \quad (1)$$

$$0.01 < y < 0.5 \quad (2)$$

$$0 \leq z < 0.3 \quad (3)$$

$$x + y + z = 1. \quad (4)$$

$$0.5 < x < 0.7 \quad (1')$$

$$0.05 < y < 0.4 \quad (2')$$

$$0 \leq z < 0.3 \quad (3')$$

$$x + y + z = 1 \quad (4')$$

After that, by dipping the $C_xN_yH_z$ film 14 in the fluorine-based Fomblin oil, the Fomblin oil is coated on the $C_xN_yH_z$ film 14. Next, by annealing the substrate to be deposited 2 at a temperature of 150° C. for 1 hour, a fluorinated organic film 15 that has a thickness of 4 nm and functions as a solid lubricant is formed on the $C_xN_yH_z$ film 14. An evaporation method may be used as the method for producing the fluorinated organic film 15, and an evaporation temperature in the case is 110° C.

Here, the CVD apparatus shown in FIG. 2 will be explained.

The CVD apparatus has a chamber 1, and the chamber 1 is provided with an exhaust port for evacuating the inside of the chamber 1. The exhaust port is connected to a vacuum pump (not illustrated).

In the lower part inside the chamber 1, a holding electrode 4 that holds the substrate to be deposited 2 is disposed. The holding electrode 4 is electrically connected to a high-frequency power source 6 having, for example, a frequency of 13.56 MHz, and the holding electrode 4 acts also as an RF application electrode (RF cathode). A high-frequency output density of the holding electrode 4 to which a high-frequency wave is applied by the high-frequency power source 6 is, for example, $1 \times 10^{-2}$ W/cm$^2$ or less. The circumference and the lower portion of the holding electrode 4 are shielded by an earth shield 5. Meanwhile, in the present embodiment, the high-frequency power source 6 is used, but another power source such as a direct-current power source or a microwave power source may be used.

In the upper side inside the chamber 1, a gas shower electrode (counter electrode) 7 is disposed facing and at a position parallel to the holding electrode 4. These are a pair of parallel flat plate electrodes. The gas shower electrode 7 is connected to the ground potential (not illustrated). On the lower surface of the gas shower electrode 7, there are formed a plurality of supply ports (not illustrated) for supplying a shower-like raw material gas to the side of the substrate to be deposited 2 on which the DLC film 13 has been formed (the space between the gas shower electrode 7 and the holding electrode 4).

In the inside of the gas shower electrode 7, a gas introduction path (not illustrated) is provided. One side of the gas introduction path is connected to the supply port, and the other side of the gas introduction path is connected to one end of a supply piping 28 of the raw material gas. The circumference of the supply piping 28 is covered with a heater 21, and the supply piping 28 is branched into two lines. One of other ends of the supply piping 28 is connected to a valve 29, and the valve 29 is connected to a mass flow controller 31 via a piping. The mass flow controller 31 is connected to a valve 30 via a piping, and the valve 30 is connected to an $N_2$ supply source via a piping.

The other end of the other of the supply piping 28 is connected to a valve 19. The valve 19 is connected to a mass flow controller 20 via a piping, and the mass flow controller 20 is connected to a valve 18 via a piping. The valve 18 is connected to a raw material vessel for housing a starting material 16 via a piping. The raw material vessel, the valves 18 and 19 and the mass flow controller 20 are disposed in a constant-temperature bath 17.

The starting material 16 is composed of $C_xH_yN_z$, is a liquid or a solid at ordinary temperature, satisfies formulae (1) to (4) below, and preferably satisfies formulae (1') to (4') below. Here, X, Y and Z are natural numbers.

$$4 \leq X \leq 12 \quad (1)$$

$$0 \leq Y \leq 4 \quad (2)$$

$$2 \leq Z \leq 12 \quad (3)$$

$$Y/X < 1 \text{(more preferably } 3/7 \leq Y/X < 1) \quad (4)$$

$$4 \leq X \leq 7 \quad (1')$$

$$0 \leq Y \leq 4 \quad (2')$$

$$2 \leq Z \leq 4 \quad (3')$$

$$Y/X < 1 \text{(more preferably } 3/7 \leq Y/X < 1) \quad (4')$$

The reason why the formula (1) is set is that, when X is less than 4, the starting material becomes gaseous at ordinary temperature and, when X is more than 12, the evaporation of the starting material becomes difficult.

Specific examples of the starting materials 16 include $C_4H_2N_2$ (fumaric nitrile), $C_5H_3N_3$ (cyanopyrazine, cyanopyrimidine) $C_7H_3N_3$ (pyridine dicarbonitrile), and the like.

Next, the deposition method using the CVD apparatus shown in FIG. 2 will be explained.

The substrate to be deposited 2 is inserted into the chamber 1, and the substrate to be deposited 2 is held on the holding electrode 4 in the chamber 1. Subsequently, the inside of the chamber 1 is evacuated with a vacuum pump.

Subsequently, heating of the starting material 16 in the constant-temperature bath 17 is caused to be vaporized, the vaporized raw material gas is subjected to flow rate control by the mass flow controller 20, and the flow rate-controlled raw material gas is introduced into the chamber 1 from the supply port of the gas shower electrode 7, the raw material gas being in a shower form, through the supply piping and the gas introduction path while maintaining the temperature with a heater 21 so as not to be lowered, which is supplied to the surface of the substrate to be deposited 2. The supplied raw material gas passes between the holding electrode 4 and the earth shield 5 and is discharged with a vacuum pump to the outside of the chamber 1. Then, by the control to be prescribed pressure and the flow rate of the raw material gas through the balance between the supply amount and the discharge of the raw material gas, the inside of the chamber 1 is made into a raw material gas atmosphere, application of a high-frequency wave (RF) of, for example, 13.56 MHz with the high-frequency power source 6 generates a plasma, and the $C_xN_yH_z$ film 14 is deposited on the DLC film 13 of the substrate to be deposited 2. Meanwhile, in the present embodiment, no $N_2$ gas is added to the raw material gas, but $N_2$ gas from an $N_2$ supply source may be added to the raw material gas after controlling the flow rate with the mass flow controller 31. Consequently, the content of N in the $C_xN_yH_z$ film 14 can be increased.

Subsequently, the power supply from the high-frequency power source 6 is stopped, the supply of the raw material gas from the supply port of the gas shower electrode 7 is stopped, and the deposition treatment is completed.

According to the present embodiment, through the use of the above-mentioned starting material 16, the $C_xN_yH_z$ film 14 that has high density with a small hydrogen content can be deposited. Consequently, the $C_xN_yH_z$ film 14 can have a barrier property for preventing impurities such as Cr from being eluted from the magnetic layer 12 to thereby reach the fluorinated organic film 15 (so-called corrosion). By giving, also to the $C_xN_yH_z$ film 14, the barrier property conventionally given only to the DLC film 13, it becomes possible to prevent the corrosion even when the DLC film 13 is made smaller. As a result, the thickness of the film between the magnetic layer 12 and the fluorinated organic film 15 can be made smaller than the conventional one.

In addition, since the contact angle of water with the surface of the $C_xN_yH_z$ film 14 can be made to be 50° or less, the adhesion force between the fluorinated organic film 15 and the $C_xN_yH_z$ film 14 can be sufficiently secured, and the peeling off of the fluorinated organic film 15 from the $C_xN_yH_z$ film 14 can be suppressed.

Meanwhile, in the present embodiment, the DLC film 13 is formed on the magnetic layer 12, the $C_xN_yH_z$ film 14 is formed on the DLC film 13, and the fluorinated organic film 15 is formed on the $C_xN_yH_z$ film 14, but the $C_xN_yH_z$ film 14 may be formed on the magnetic layer 12 and the fluorinated organic film 15 may be formed on the $C_xN_yH_z$ film 14.

Furthermore, in the present embodiment, there is prepared a substrate to be deposited 10, in which at least the magnetic layer 12 is formed on the nonmagnetic substrate 11, and the $C_xN_yH_z$ film 14 is formed on the DLC film 13 deposited on the substrate to be deposited 10, but the configuration is not limited to this. The $C_xN_yH_z$ film 14 may be formed on another substrate. As another substrate in this case, various substrates can be used, and for example, an electronic device may be used.

Moreover, in the present embodiment, the $C_xN_yH_z$ film 14 is deposited using the CVD apparatus shown in FIG. 2, but CVD apparatuses shown in each of FIG. 3 to FIG. 9 may be used. Meanwhile, in FIG. 3 to FIG. 9, the same sign is attached to the same portion as that in FIG. 2, and the explanation of the same portion is omitted.

Modified Example 1

Figure 3:
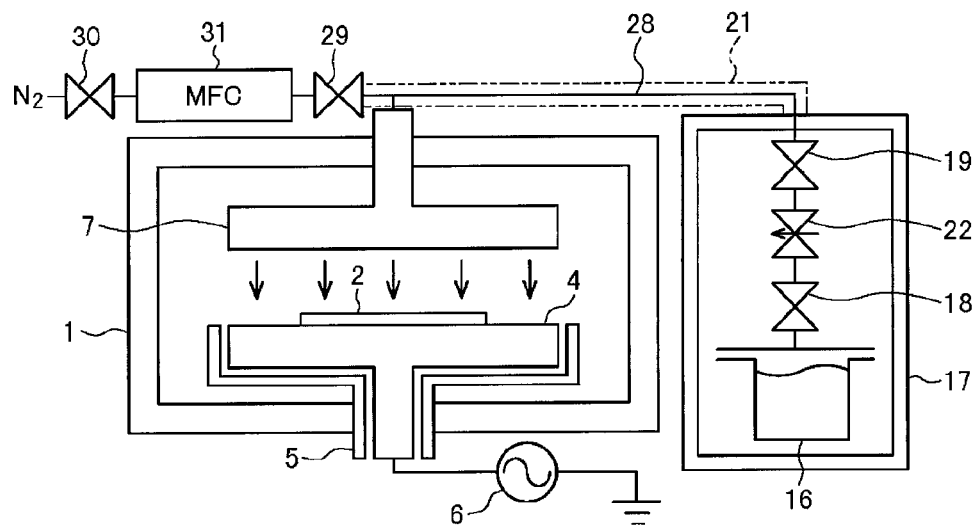
FIG. 3 is a cross-sectional view showing schematically a CVD apparatus according to a modified example 1.

The CVD apparatus shown in FIG. 3 has the valve 19, and the valve 19 is connected to a needle valve 22 via a piping. The needle valve 22 is connected to the valve 18 via a piping, and the valve 18 is connected to the raw material vessel for housing the starting material 16 via a piping. The raw material vessel, the valves 18 and 19, and the needle valve 22 are disposed in the constant-temperature bath 17.

Specific examples of the starting materials 16 include $C_6H_2N_4$ (dicyanopyrazine), $C_5H_2N_4$ (dicyanoimidazole), $C_{10}H_2N_4$ (tetracyanobenzene), $C_{12}H_4N_4$ (tetracyanoquinodimethane), and the like.

Specific examples of the starting materials 16 include $C_4H_2N_2$ (fumaric nitrile), $C_5H_3N_3$ (cyanopyrazine, cyanopyrimidine), $C_7H_3N_3$ (pyridine dicarbonitrile), $C_6N_4$ (tetracyanoethylene), and the like.

Subsequently, the deposition method using the CVD apparatus shown in FIG. 3 will be explained.

The substrate to be deposited 2 is inserted into the chamber 1, and the substrate to be deposited 2 is held on the holding electrode 4 in the chamber 1. Next, the inside of the chamber 1 is evacuated with a vacuum pump.

Subsequently, heating of the starting material 16 in the constant-temperature bath 17 is caused to be vaporized, the vaporized raw material gas is subjected to flow rate control by the needle valve 22, and the flow rate-controlled raw material gas is introduced into the chamber 1 from the supply port of the gas shower electrode 7, the raw material gas being in a shower form, through the supply piping and the gas introduction path while maintaining the temperature with a heater 21 so as not to be lowered, which is supplied to the surface of the substrate to be deposited 2. The supplied raw material gas passes between the holding electrode 4 and the earth shield 5 and is discharged with a vacuum pump to the outside of the chamber 1. Then, by the control to be prescribed pressure and the flow rate of the raw material gas through the balance between the supply amount and the discharge of the raw material gas, the inside of the chamber 1 is made into a raw material gas atmosphere, application of a high-frequency wave (RF) of, for example, 13.56 MHz with the high-frequency power source 6 generates a plasma, and the $C_xN_yH_z$ film 14 is deposited on the DLC film 13 of the substrate to be deposited 2. Meanwhile, in the modified example, no $N_2$ gas is added to the raw material gas, but $N_2$ gas from an $N_2$ supply source may be added to the raw material gas after controlling the flow rate with the mass flow controller 31. Consequently, the content of N in the $C_xN_yH_z$ film 14 can be increased.

In the CVD apparatus shown in FIG. 3, since the flow rate is controlled with the needle valve 22, it is possible to control even the flow rate of the starting material 16 that is vaporized by heating to a high temperature exceeding the upper limit of a usable temperature of a mass flow controller, and to deposit the $C_xN_yH_z$ film 14.

Also in the $C_xN_yH_z$ film 14 deposited with the CVD apparatus shown in FIG. 3, the same effect as that in the present embodiment (the contact angle of water with the surface being 50° or less, and having a barrier property) can be obtained.

Modified Example 2

Figure 4:
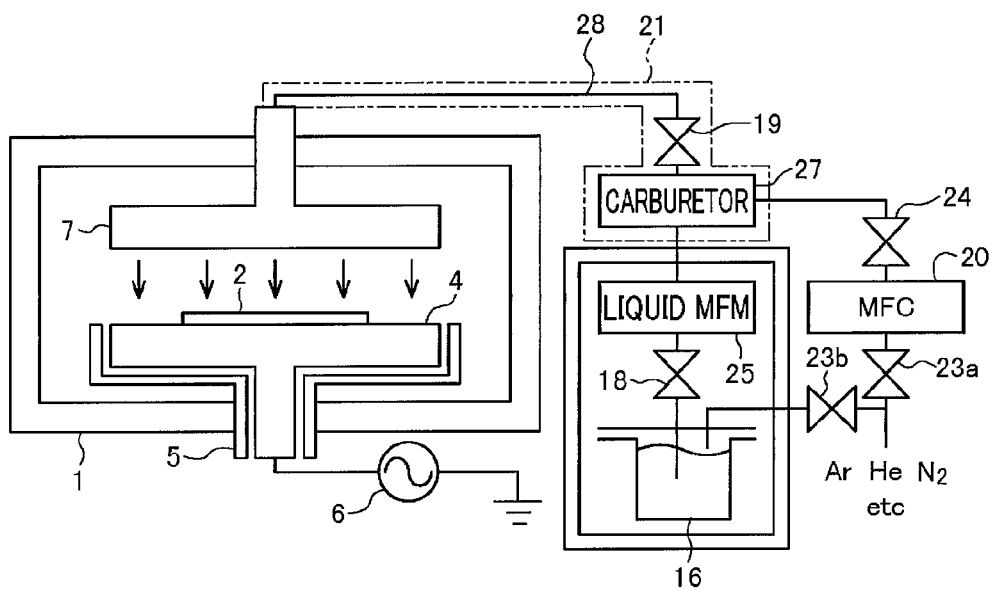
FIG. 4 is a cross-sectional view showing schematically a CVD apparatus according to a modified example 2.

The CVD apparatus shown in FIG. 4 has the valve 19, and the valve 19 is connected to a carburetor 27 via a piping. The carburetor 27 and the valve 19 are configured to be heated by the heater 21. The carburetor 27 is connected to a liquid MFM 25 via a piping, and the liquid MFM 25 is connected to the valve 18 via a piping. The valve 18 is connected to a raw material vessel for housing the starting material 16 via a piping. The raw material vessel, the valve 18 and the liquid MFM 25 are disposed in the constant-temperature bath 17. The carburetor 27 is connected to the valve 24 via a piping, and the valve 24 is connected to the mass flow controller 20 via a piping. The mass flow controller 20 is connected to a valve 23a via a piping, and the valve 23a is connected to a carrier gas supply source (Ar, He, $N_2$ or the like) via a piping. The carrier gas supply source is connected to a valve 23b via a piping, and the valve 23b is connected to the inside of the raw material vessel via a piping.

Subsequently, the deposition method using the CVD apparatus shown in FIG. 4 will be explained.

The substrate to be deposited 2 is inserted into the chamber 1, and the substrate to be deposited 2 is held on the holding electrode 4 in the chamber 1. Next, the inside of the chamber 1 is evacuated with a vacuum pump.

Subsequently, the starting material 16 is heated to a prescribed temperature in the constant-temperature bath 17, the starting material in a liquid state is pressured and sent to the liquid MFM 25 with a carrier gas such as $N_2$, the starting material in a liquid state, having the flow rate controlled by the liquid MFM, is introduced into a carburetor 27, and at the same time, the carrier gas from the carrier gas supply source is introduced into the carburetor 27, through flow-rate control by the mass flow controller 20. Heating of the starting material with the carburetor 27 is caused to be vaporized, the raw material gas containing the vaporized starting material and the carrier gas is introduced into the chamber 1 from the supply port of the gas shower electrode 7, the raw material gas being in a shower form, through the supply piping 28 and the gas introduction path while maintaining the temperature with a heater 21 so as not to be lowered, which is supplied to the surface of the substrate to be deposited 2. The supplied raw material gas passes between the holding electrode 4 and the earth shield 5 and is discharged with a vacuum pump to the outside of the chamber 1. Then, by the control to be prescribed pressure and the flow rate of the raw material gas through the balance between the supply amount and the discharge of the raw material gas, the inside of the chamber 1 is made into a raw material gas atmosphere, application of a high-frequency wave (RF) of, for example, 13.56 MHz with the high-frequency power source 6 generates a plasma, and the $C_xN_yH_z$ film 14 is deposited on the DLC film 13 of the substrate to be deposited 2. Meanwhile, in the modified example, no $N_2$ gas is added to the raw material gas, but $N_2$ gas from an $N_2$ supply source may be added to the raw material gas after controlling the flow rate with the mass flow controller 31. Consequently, the content of N in the $C_xN_yH_z$ film 14 can be increased.

Also in the $C_xN_yH_z$ film 14 deposited with the CVD apparatus shown in FIG. 4, the same effect as that in the present embodiment (the contact angle of water with the surface being 50° or less, and having a barrier property) can be obtained.

Modified Example 3

Figure 5:
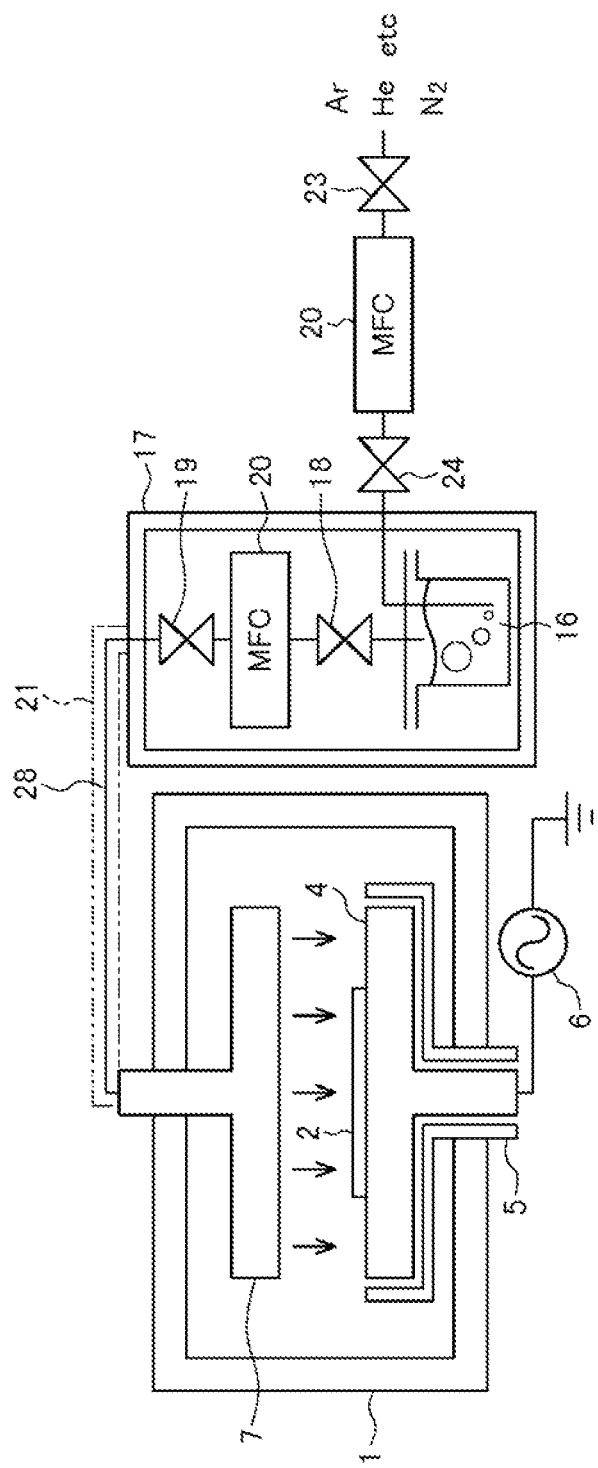
FIG. 5 is a cross-sectional view showing schematically a CVD apparatus according to a modified example 3.

In the CVD apparatus shown in FIG. 5, the liquid MFM 25 and the carburetor 27 shown in FIG. 4 are changed to the mass flow controller 20.

Next, a method for supplying the raw material gas to a substrate to be treated 2 in the deposition method using the CVD apparatus shown in FIG. 5 will be explained. Meanwhile, deposition methods other than the supply method are the same as those in the present embodiment.

While causing the starting material 16 to bubble by supplying the carrier gas from the carrier gas supply source, to the raw material vessel, through flow-rate control by the mass flow controller 20, heating of the starting material 16 in the constant-temperature bath 17 is caused to be vaporized. The vaporized raw material gas and the carrier gas are subjected to flow rate control by the mass flow controller 20, and the flow rate-controlled raw material gas and the carrier gas are introduced into the chamber 1 from the supply port of the gas shower electrode 7, the raw material gas and carrier gas being in a shower form, through the supply piping 28 and the gas introduction path while maintaining the temperature with a heater 21 so as not to be lowered, which is supplied to the surface of the substrate to be deposited 2.

Also in the $C_xN_yH_z$ film 14 deposited with the CVD apparatus shown in FIG. 5, the same effect as that in the present embodiment (the contact angle of water with the surface being 50° or less, and having a barrier property) can be obtained.

Modified Example 4

Figure 6:
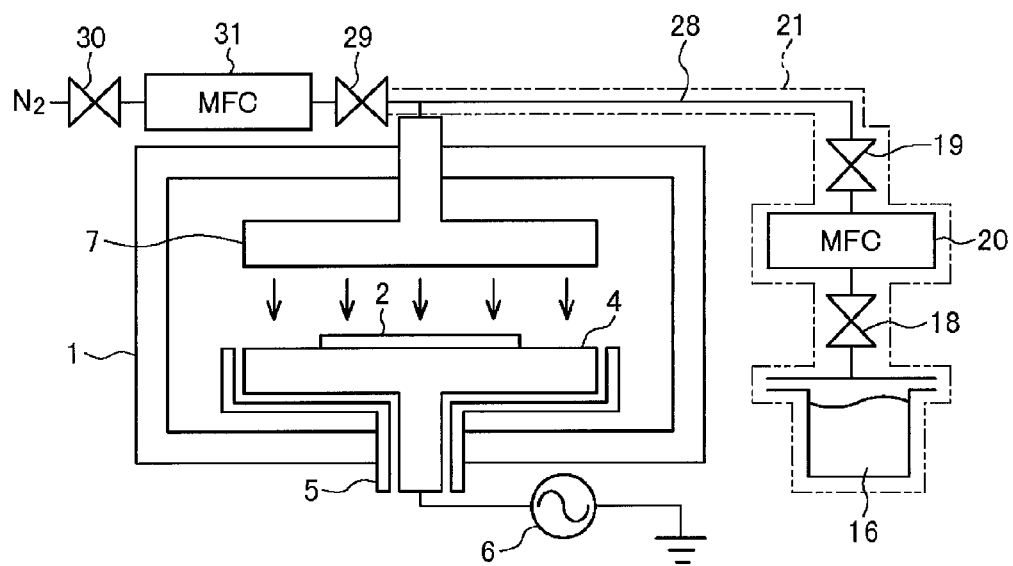
FIG. 6 is a cross-sectional view showing schematically a CVD apparatus according to a modified example 4.

In the CVD apparatus shown in FIG. 6, circumferences of the raw material vessel for housing the starting material 16, the valves 18 and 19, the mass flow controller 20, the piping and the supply piping 28 are covered with the heater 21.

Next, a method for supplying the raw material gas to a substrate to be deposited 2 in the deposition method using the CVD apparatus shown in FIG. 6 will be explained. Meanwhile, deposition methods other than the supply method are the same as those in the present embodiment.

Heating of the starting material 16 with the heater 21 is caused to be vaporized, the vaporized raw material gas is subjected to flow rate control by the mass flow controller 20, and the flow rate-controlled raw material gas is introduced into the chamber 1 from the supply port of the gas shower electrode 7, the raw material gas being in a shower form, through the supply piping 28 and the gas introduction path while maintaining the temperature with a heater 21 so as not to be lowered, which is supplied to the surface of the substrate to be deposited 2.

Also in the $C_xN_yH_z$ film 14 deposited with the CVD apparatus shown in FIG. 6, the same effect as that in the present embodiment (the contact angle of water with the surface being 50° or less, and having a barrier property) can be obtained.

Modified Example 5

Figure 7:
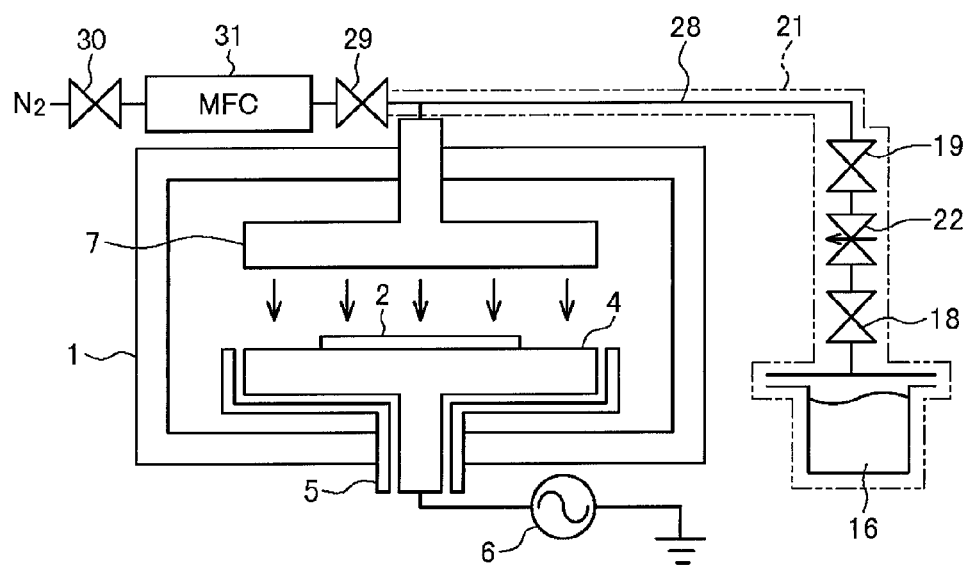
FIG. 7 is a cross-sectional view showing schematically a CVD apparatus according to a modified example 5.

In the CVD apparatus shown in FIG. 7, the mass flow controller 20 shown in FIG. 6 is changed to the needle valve 22.

Next, a method for supplying the raw material gas to a substrate to be treated 2 in the deposition method using the CVD apparatus shown in FIG. 7 will be explained. Meanwhile, deposition methods other than the supply method are the same as those in the present embodiment.

Heating of the starting material 16 with the heater 21 is caused to be vaporized, the vaporized raw material gas is subjected to flow rate control by the needle valve 22, and the flow rate-controlled raw material gas is introduced into the chamber 1 from the supply port of the gas shower electrode 7, the raw material gas being in a shower form, through the supply piping 28 and the gas introduction path while maintaining the temperature with a heater 21 so as not to be lowered, which is supplied to the surface of the substrate to be deposited 2.

Also in the $C_xN_yH_z$ film 14 deposited with the CVD apparatus shown in FIG. 7, the same effect as that in the present embodiment (the contact angle of water with the surface being 50° or less, and having a barrier property) can be obtained.

Modified Example 6

Figure 8:
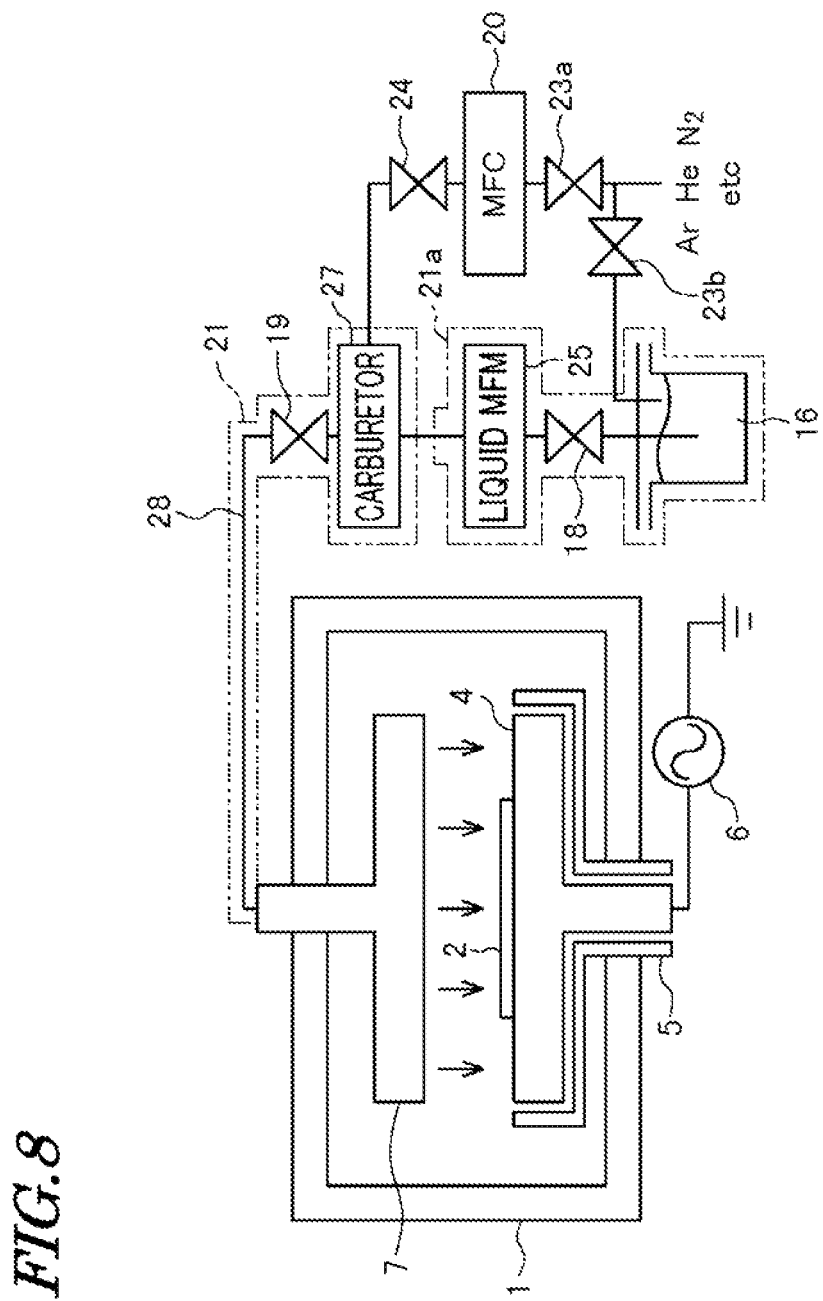
FIG. 8 is a cross-sectional view showing schematically a CVD apparatus according to a modified example 6.

In the CVD apparatus shown in FIG. 8, the constant-temperature bath 17 shown in FIG. 4 is changed to a heater 21a.

Next, a method for supplying the raw material gas to a substrate to be deposited 2 in the deposition method using the CVD apparatus shown in FIG. 8 will be explained. Meanwhile, deposition methods other than the supply method are the same as those in the present embodiment.

The starting material 16 is heated to a prescribed temperature with the heater 21a, the starting material in a liquid state is pressured and sent to the liquid MFM 25 with a carrier gas such as $N_2$, the starting material in a liquid state, having the flow rate controlled by the liquid MFM, is introduced into the carburetor 27, and at the same time, the carrier gas from the carrier gas supply source is introduced into the carburetor 27, through flow-rate control by the mass flow controller 20. The starting material is vaporized with the carburetor 27, the raw material gas containing the vaporized starting material and the carrier gas is introduced into the chamber 1 from the supply port of the gas shower electrode 7, the raw material gas being in a shower form, through the supply piping 28 and the gas introduction path while maintaining the temperature with a heater 21 so as not to be lowered, which is supplied to the surface of the substrate to be deposited 2.

Also in the $C_xN_yH_z$ film 14 deposited with the CVD apparatus shown in FIG. 8, the same effect as that in the present embodiment (the contact angle of water with the surface being 50° or less, and having a barrier property) can be obtained.

Modified Example 7

Figure 9:
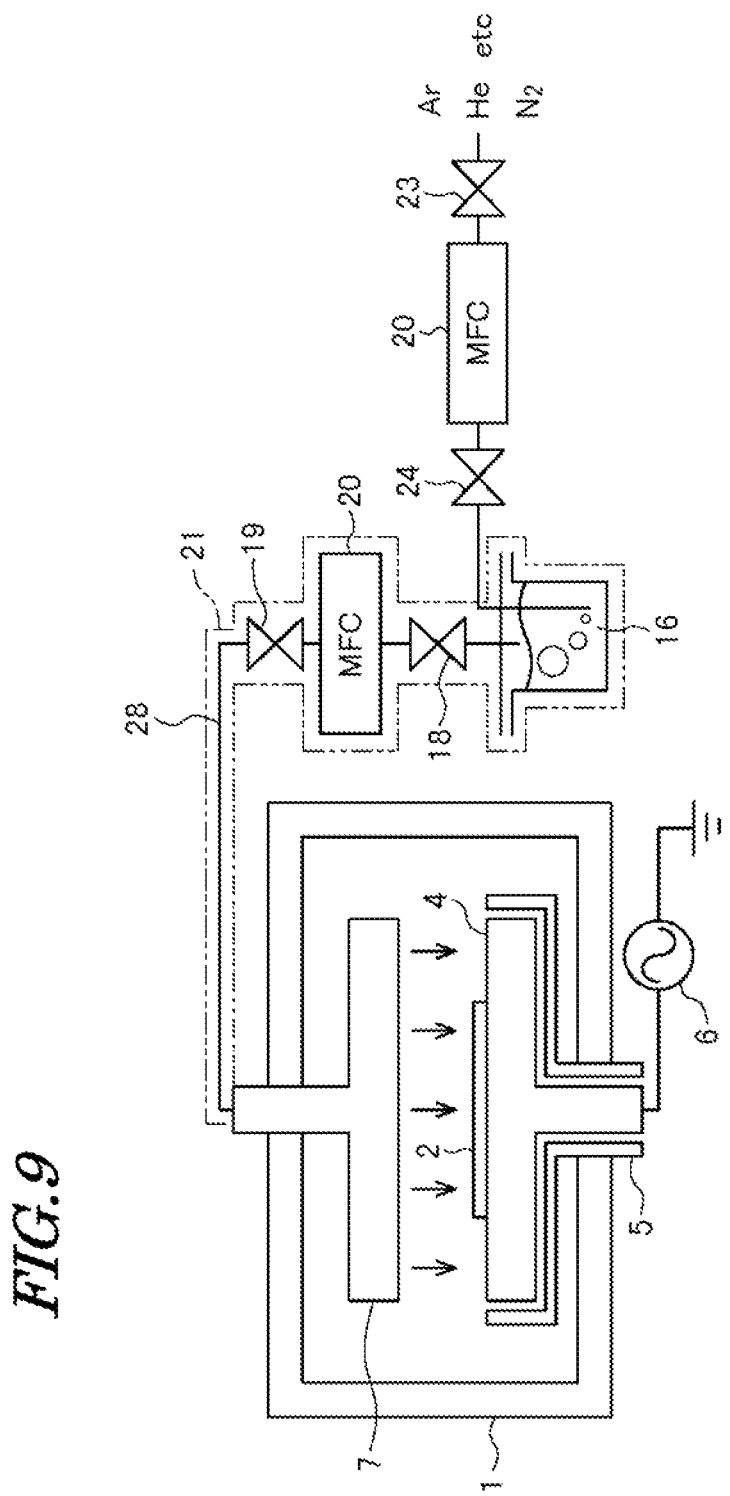
FIG. 9 is a cross-sectional view showing schematically a CVD apparatus according to a modified example 7.

In the CVD apparatus shown in FIG. 9, the constant-temperature bath 17 shown in FIG. 5 is changed to the heater 21.

Next, a method for supplying the raw material gas to a substrate to be treated 2 in the deposition method using the CVD apparatus shown in FIG. 9 will be explained. Meanwhile, deposition methods other than the supply method are the same as those in the present embodiment.

While causing the starting material 16 to bubble by supplying the carrier gas from the carrier gas supply source, to the raw material vessel, through flow-rate control by the mass flow controller 20, heating of the starting material 16 with the heater 21 is caused to be vaporized. The vaporized raw material gas and the carrier gas are subjected to flow rate control by the mass flow controller 20, and the flow rate-controlled raw material gas and the carrier gas are introduced into the chamber 1 from the supply port of the gas shower electrode 7, the raw material gas and carrier gas being in a shower form, through the supply piping 28 and the gas introduction path while maintaining the temperature with a heater 21 so as not to be lowered, which is supplied to the surface of the substrate to be deposited 2.

Also in the $C_xN_yH_z$ film 14 deposited with the CVD apparatus shown in FIG. 9, the same effect as that in the present embodiment (the contact angle of water with the surface being 50° or less, and having a barrier property) can be obtained.

Second Embodiment

In the method for manufacturing a magnetic recording medium according to the present embodiment, since the process up to the formation of the $C_xN_yH_z$ film 14 on the DLC film 13 shown in FIG. 1 is the same as the process in the first embodiment, the explanation is omitted and there will be given an explanation of the process for forming the fluorinated organic film 15 on the $C_xN_yH_z$ film 14 by using the plasma CVD apparatus shown in FIG. 10 and the subsequent process. Meanwhile, the present embodiment is the same as the first embodiment, except for the process of forming the fluorinated organic film 15.

Figure 10:
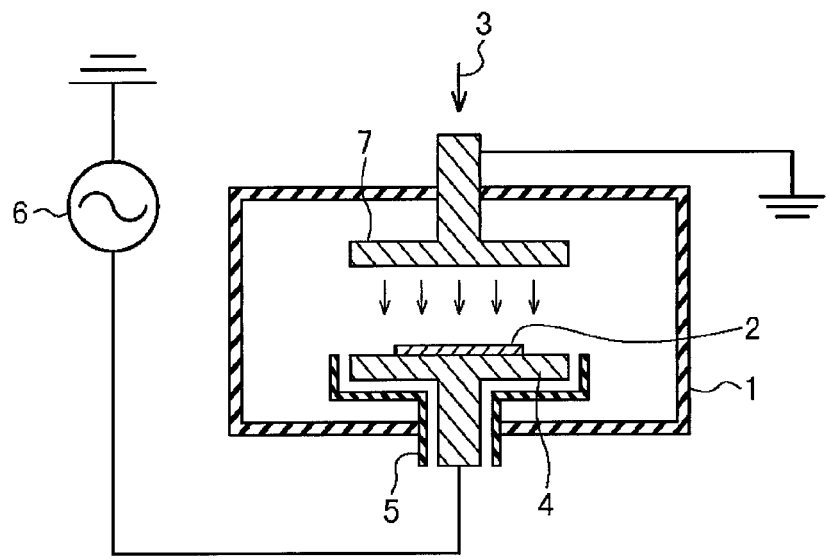
FIG. 10 is a cross-sectional view showing schematically a plasma CVD apparatus for depositing a fluorinated organic film according to one aspect of the present invention.

FIG. 10 is a cross-sectional view showing schematically a plasma CVD apparatus for depositing the fluorinated organic film according to one aspect of the present invention.

The plasma CVD apparatus has the chamber 1, and in the lower part inside the chamber 1, the holding electrode 4 for holding the substrate to be treated 2 is disposed.

The holding electrode 4 is electrically connected to the high-frequency power source 6 of, for example, frequency of 13.56 MHz, and the holding electrode 4 also acts as an RF application electrode. The circumference and the lower portion of the holding electrode 4 are shielded by the earth shield 5. Meanwhile, in the present embodiment, the high-frequency power source 6 is used, but another power source such as a direct-current power source or a microwave power source may be used.

In the upper part inside the chamber 1, the gas shower electrode (counter electrode) 7 is disposed facing and at a position parallel to the holding electrode 4. These are a pair of parallel flat plate electrodes. The gas shower electrode 7 is connected to the ground potential. Meanwhile, in the present embodiment, the power source is connected to the holding electrode 4, and the ground potential is connected to the gas shower electrode, but the ground potential may be connected to the holding electrode 4 and the power source may be connected to the gas shower electrode.

On the lower surface of the gas shower electrode 7, there are formed a plurality of supply ports (not illustrated) for supplying a raw material gas in a shower form to the side of the substrate to be treated 2, on which the $C_xN_yH_z$ film 14 has been formed (the space between the gas shower electrode 7 and the holding electrode 4). As the raw material gas, one having an organic raw material gas containing carbon and fluorine can be used. The organic raw material gas preferably has three or more carbons.

In the inside of the gas shower electrode 7, a gas introduction path (not illustrated) is provided. One side of the gas introduction path is connected to the supply port, and the other side of the gas introduction path is connected to a supply mechanism 3 of the raw material gas. Furthermore, the chamber 1 is provided with an exhaust port for evacuating the inside of the chamber 1. The exhaust port is connected to a vacuum pump (not illustrated).

Moreover, the plasma CVD apparatus has a control section (not illustrated) for controlling the high-frequency power source 6, the supply mechanism 3 of the raw material gas, the vacuum pump and the like, and the control section is for controlling the plasma CVD apparatus so as to perform CVD deposition to be mentioned later.

Next, the process for forming the fluorinated organic film 15 on the $C_xN_yH_z$ film 14 shown in FIG. 1 by using the plasma CVD apparatus shown in FIG. 10 will be explained.

In the present embodiment, as the fluorinated organic film 15, any film of the $C_aF_b$ film, the $C_aF_bN_c$ film, a $C_aF_bO_d$ film and a $C_aF_bN_cO_d$ film is used. Here, a, b, c and d are natural numbers.

Hereinafter, the deposition of any film of the $C_aF_b$ film, the $C_aF_bN_c$ film, the $C_aF_bO_d$ film and the $C_aF_bN_cO_d$ film will be explained in detail.

The substrate to be deposited 2 is inserted into the chamber 1 shown in FIG. 10, and the substrate to be deposited 2 is held on the holding electrode 4 in the chamber 1.

Next, the inside of the chamber 1 is evacuated with the vacuum pump. Subsequently, the raw material gas in a shower form is introduced into the chamber 1 from the supply port of the gas shower electrode 7, and is supplied to the surface of the substrate to be deposited 2. The supplied raw material gas passes between the holding electrode 4 and the earth shield 5, and is discharged to the outside of the chamber 1 with the vacuum pump. Then, by the control to be prescribed pressure and the flow rate of the raw material gas through the balance between the supply amount and the discharge of the raw material gas, the inside of the chamber 1 is made into a raw material gas atmosphere, application of a high-frequency wave (RF) of, for example, 13.56 MHz with the high-frequency power source 6 generates a plasma, and the $C_aF_b$ film 15 is deposited on the DLC film 13 of the substrate to be deposited 2. As to deposition conditions at this time, the deposition is preferably performed under conditions that the pressure is 0.01 Pa to atmospheric pressure, the treatment temperature is ordinary temperature, and the direct-current voltage component when the high-frequency plasma is to be formed is +150 V to −150 V (more preferably +50 V to −50 V). By suppressing the direct-current voltage component to be low as described above, the plasma damage to films of layers lower than the fluorinated organic film 15 can be suppressed.

Subsequently, the power supply from the high-frequency power source 6 is stopped, the supply of the raw material gas from the supply port of the gas shower electrode 7 is stopped, and the deposition treatment is completed.

As the above-mentioned raw material gas, the use of one having an organic raw material gas containing carbon and fluorine is preferable.

Specific examples of the organic raw material gases are as follows.

The organic raw material gas when a $C_aF_b$ film is to be deposited as the film 15 has at least one of $C_3F_6$, $C_4F_6$, $C_6F_6$, $C_6F_{12}$, $C_6F_{14}$, $C_7F_8$, $C_7F_{14}$, $C_7F_{16}$, $C_8F_{16}$, $C_8F_{18}$, $C_9F_{18}$, $C_9F_{20}$, $C_{10}F_8$, $C_{10}F_{18}$, $C_{11}F_{20}$, $C_{12}F_{10}$, $C_{13}F_{28}$, $C_{15}F_{32}$, $C_{20}F_{42}$, and $C_{24}F_{50}$.

The organic raw material gas when the $C_aF_bN_c$ film is to be deposited as the film 15 has at least one of $C_3F_3N_3$, $C_3F_9N$, $C_5F_5N$, $C_6F_4N_2$, $C_6F_9N_3$, $C_6F_{12}N_2$, $C_6F_{15}N$, $C_7F_5N$, $C_8F_4N_2$, $C_9F_{21}N$, $C_{12}F_4N_4$, $C_{12}F_{27}N$, $C_{14}F_5N_2$, $C_{15}F_{33}N$, $C_{24}F_{45}N_3$, and tri (heptafluoropropyl)amine.

The organic raw material gas when the $C_aF_bO_d$ film is to be deposited as the film 15 has at least one of $C_3F_6O$, $C_4F_6O_3$, $C_4F_8O$, $C_5F_6O_3$, $C_6F_4O_2$, $C_6F_{10}O_3$, $C_8F_4O_3$, $C_8F_8O$, $C_8F_8O_2$, $C_8F_{14}O_3$, $C_{13}F_{10}O$, $C_{13}F_{10}O_3$, and $C_2F_6O$ $(C_3F_6O)_n(CF_2O)_m$.

The organic raw material gas when the $C_aF_bN_cO_d$ film is to be deposited as the film 15 has $C_7F_5NO$.

Meanwhile, in the present embodiment, the high-frequency power source 6 is used, but a direct-current power source or a microwave power source may be used. The direct-current voltage when a plasma is to be formed using the direct-current power source is preferably +150 V to −150 V (more preferably +50 V to −50 V).

The film 15 of any of the $C_aF_b$ film, the $C_aF_bN_c$ film, the $C_aF_bH_d$ film, the $C_aF_bO_e$ film, the $C_aF_bO_eH_d$ film, the $C_aF_bN_cO_e$ film and the $C_aF_bN_cO_eH_d$ film thus formed on the $C_xN_yH_z$ film 14 of the substrate to be deposited 2 has a thickness of 3 nm or less (more preferably 1 nm or less), has a large contact angle of water to thereby be water-repellent and functions as a solid lubricant. The film 15 is preferably an amorphous film. Furthermore, the Young's modulus of the film 15 is preferably 0.1 to 30 GPa.

Third Embodiment

Figure 11:
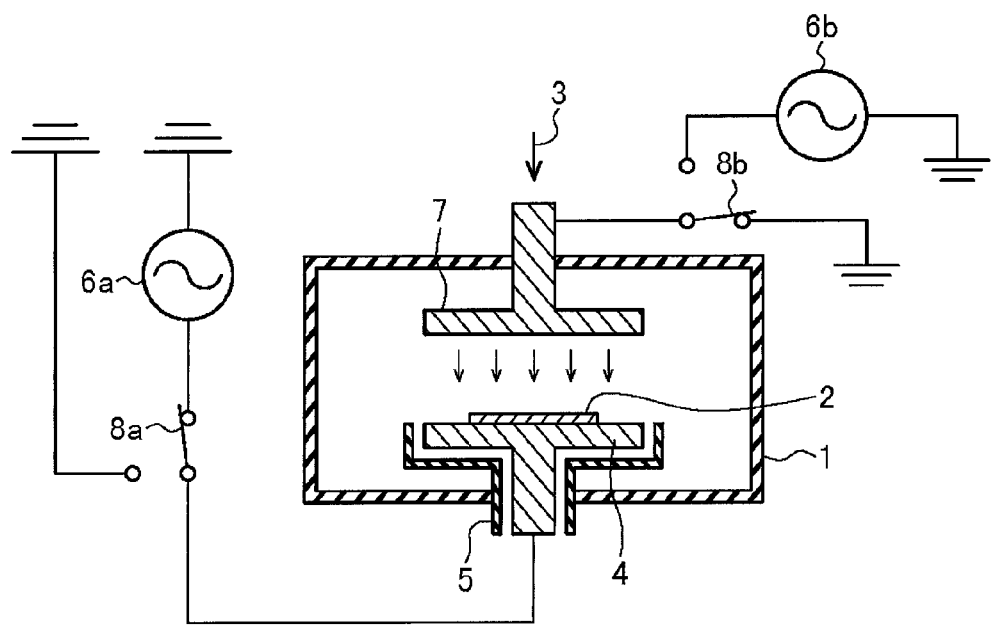
FIG. 11 is a cross-sectional view showing schematically a plasma CVD apparatus for depositing a fluorinated organic film according to one aspect of the present invention.

FIG. 11 is a cross-sectional view showing schematically a plasma CVD apparatus for depositing the fluorinated organic film according to one aspect of the present invention, in which the same sign is attached to the same portion as that in FIG. 10 and only different portions are explained.

The holding electrode 4 is electrically connected to a high-frequency power source 6a and the ground potential via a changeover switch 8a, and is configured so that high-frequency power or the ground potential is applied to the holding electrode 4 by the changeover switch 8a. Furthermore, the gas shower electrode 7 is electrically connected to a high-frequency power source 6b and the ground potential via a changeover switch 8b, and it is configured so that high-frequency power or the ground potential is applied to the gas shower electrode 7 by the changeover switch 8b. Meanwhile, in the present embodiment, high-frequency power sources 6a and 6b are used, but another power source, for example, a direct-current power source or a microwave power source may be used.

In addition, the plasma CVD apparatus has a control section (not illustrated) for controlling changeover switches 8a and 8b, high-frequency power sources 6a and 6b, the supply mechanism 3 of gas for forming plasma, the vacuum pump and the like, and the control section controls the plasma CVD apparatus so as to perform a CVD deposition treatment.

Next, the process for forming the fluorinated organic film 15 on the $C_xN_yH_z$ film 14 shown in FIG. 1 by using the plasma CVD apparatus shown in FIG. 11 will be explained, but the explanation of portions that are the same as those in the second embodiment is omitted.

(1) The case where the film 15 of any of the $C_aF_b$ film, the $C_aF_bN_c$ the film, the $C_aF_bH_d$ film, the $C_aF_bO_e$ film, the $C_aF_bO_eH_d$ film, the $C_aF_bN_cO_e$ film and the $C_aF_bN_cO_eH_d$ film is deposited on the $C_xN_yH_z$ film 14 of the substrate to be deposited 2, while connecting high-frequency power sources 6a and 6b and the ground potential to the holding electrode 4 and the gas shower electrode 7 in a first connection state The first connection state is a state where the high-frequency power source 6a and the holding electrode 4 are connected to each other through the use of the changeover switch 8a, and the ground potential and the gas shower electrode 7 are connected to each other through the use of the changeover switch 8b. Since the specific deposition method of the film 15 under the state is the same as that in the first embodiment, the explanation is omitted.

(2) The case where the film 15 of any of the $C_aF_b$ film, the $C_aF_bN_c$ film, the $C_aF_bH_d$ film, the $C_aF_bO_e$ film, the $C_aF_bO_eH_d$ film, the $C_aF_bN_cO_e$ film and the $C_aF_bN_cO_eH_d$ film is deposited on the $C_xN_yH_z$ film 14 of the substrate to be deposited 2, while connecting high-frequency power sources 6a and 6b and the ground potential to the holding electrode 4 and the gas shower electrode 7 in a second connection state.

The second connection state is a state where the ground potential and the holding electrode 4 are connected to each other through the use of the changeover switch 8a, and the high-frequency power source 6b and the gas shower electrode 7 are connected to each other through the use of the changeover switch 8b. The specific deposition method of the film 15 under the sate is as follows.

The inside of the chamber 1 is evacuated with the vacuum pump. Subsequently, the raw material gas in a shower form is introduced into the chamber 1 from the supply port of the gas shower electrode 7, and is supplied to the surface of the $C_xN_yH_z$ film 14 of the substrate to be deposited 2. The supplied raw material gas passes between the holding electrode 4 and the earth shield 5, and is discharged to the outside of the chamber 1 with the vacuum pump. Then, by balancing the supply amount and the discharge of the raw material gas thereby to control to be prescribed pressure and the flow rate of the raw material gas, the inside of the chamber 1 is set to be a raw material gas atmosphere, a high-frequency wave (RF) of, for example, 13.56 MHz is applied to the gas shower electrode 7 with the high-frequency power source 6b thereby to generate a plasma, and the film 15 of any of the $C_aF_b$ film, the $C_aF_bN_c$ film, the $C_aF_bH_d$ film, the $C_aF_bO_e$ film, the $C_aF_bO_eH_d$ film, the $C_aF_bN_cO_e$ film and the $C_aF_bN_cO_eH_d$ film is deposited on the DLC film 13 of the substrate to be deposited 2. As to deposition conditions at this time, the deposition is preferably performed under the conditions that the pressure is 0.01 Pa to atmospheric pressure, the treatment temperature is ordinary temperature, and the direct-current voltage component when the high-frequency plasma is to be formed is +150 V to −150 V (more preferably +50 V to −50 V).

Subsequently, the power supply from the power source for plasma is stopped, the supply of the raw material gas from the supply port of the gas shower electrode 7 is stopped, and the deposition treatment is completed.

Also in the present embodiment, the same effect as that in the second embodiment can be obtained.

EXAMPLE

Example 1

Figure 12:
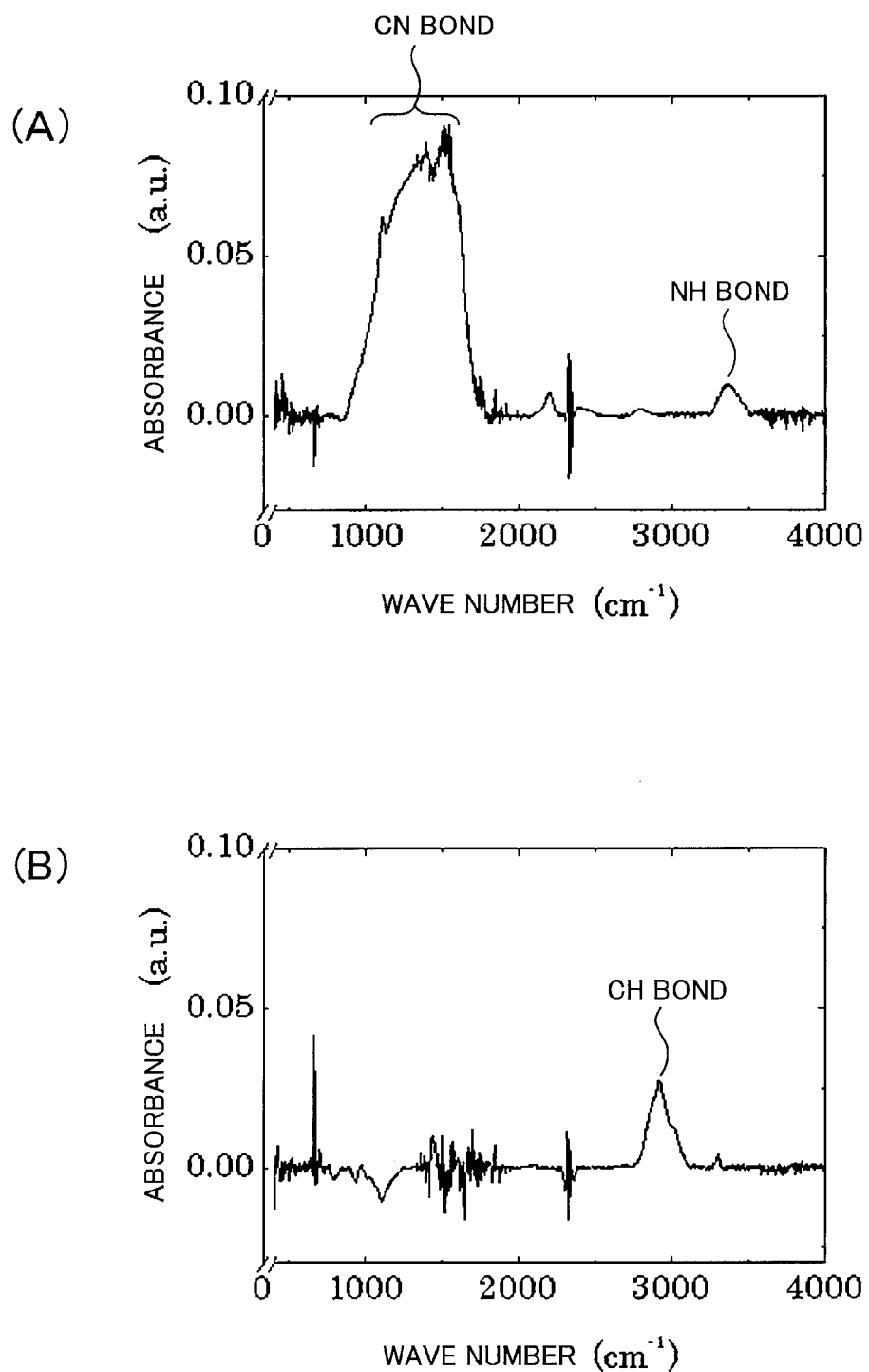
FIG. 12(A) is a drawing showing the result of analyzing a $C_xN_yH_z$ film by FT-IR.
FIG. 12(B) is a drawing showing the result of analyzing a DLC film by FT-IR.

A $C_xN_yH_z$ film was deposited on a substrate, and the $C_xN_yH_z$ film was analyzed by FT-IR. The Result is shown in FIG. 12(A).
(Deposition Condition of $C_xN_yH_z$ Film)
Substrate: Si
Deposition apparatus: CVD apparatus shown in FIG. 6
Starting material: cyanopyrazine
Gas flow rate: FULL OPEN (mass flow for toluene of 10 sccm was used)
Gas pressure: 5 Pa
Frequency of high-frequency power source: 380 kHz
High-frequency output: 900 W
Deposition time: 10 min
As a Comparative Example, a DLC film was deposited on a substrate, and the DLC film was analyzed by FT-IR. The result is shown in FIG. 12(B).

(Deposition Condition of DLC Film)
Substrate: Si
Deposition apparatus: CVD apparatus shown in FIG. 6
Starting material: toluene
Gas flow rate: 30 sccm
Gas pressure: 0.5 Pa
Frequency of high-frequency power source: 13.56 MHz
High-frequency output: 100 W
Deposition time: 20 min
(Experimental Results)
FIGS. 12(A) and 12(B) show results of FT-IR analysis, in which the horizontal axis shows the wave number ($cm^{-1}$), and the vertical axis shows the absorbance (a.u.).

As shown in FIG. 12(A), in the $C_xN_yH_z$ film, a CN bond and an NH bond were detected, and as shown in FIG. 12(B), in the DLC film, a CH bond was detected.

Example 2

A $C_xN_yH_z$ film (CVD-CN) was deposited on a substrate, and each of the ashing rate, the contact angle of water and XPS (at %) of the $C_xN_yH_z$ film was measured. Results are shown in Table 1. As shown in the XPS measurement result in Table 1, the $C_xN_yH_z$ film of the Example has x, y and z which fall within the range of those of the $C_xN_yH_z$ film 14 in the first embodiment.
(Deposition Condition of $C_xN_yH_z$ Film)
Substrate: Si
Deposition apparatus: CVD apparatus shown in FIG. 13
Starting material: cyanopyrazine
Gas flow rate: 3.3 sccm (mass flow for toluene was used)
Pressure: 0.3 Pa
Hot cathode 203: tantalum filament
Output of AC power source 205: 220 W
Current of DC power source 207: 1650 mA
Voltage of DC power source 212: 250 V
External magnetic field: 50 G
Deposition time: XPS: 42 sec (25 nm), contact angle of water: 0.8 sec (0.5 nm)

As Comparative Example, a DLC film was deposited on a substrate, and each of the ashing rate, the contact angle of water, XPS (at %) and the hydrogen content of the DLC film was measured. Results are shown in Table 2.
(Deposition Condition of DLC Film)
Substrate: Si
Deposition apparatus: CVD apparatus shown in FIG. 13
Starting material: high purity toluene
Gas flow rate: 3.3 sccm
Pressure: 0.3 Pa
Hot cathode 203: tantalum filament
Output of AC power source 205: 220 W
Current of DC power source 207: 1650 mA
Voltage of DC power source 212: 250 V
External magnetic field: 50 G
Deposition time: XPS: 21 sec (30 nm), contact angle of water: 0.7 sec (10 nm), RBS/ERDA: 42 sec (60 nm)
(Ashing Condition)
Gas: $O_2$
Gas flow rate: 50 sccm
Pressure: 30 Pa
Electrode: parallel flat plate type Frequency of high-frequency wave applied to electrode: 13.56 MHz Output of high-frequency wave applied to electrode: 500 W (RBS/ERDA)

Apparatus: IBA-7500, manufactured by Shimadzu Corporation

He energy: 2.3 MeV

He charge: 72 μC

ERDA detector angle: 30°

Incident angle to sample: 75°

Auxiliary detector (RBS) angle: 160°

(Measurement of Contact Angle of Water)

Apparatus: contact angle meter Drop Master 300, manufactured by Kyowa Interface Science Co., Ltd Measuring method: drop method Analysis method: θ/2 method Liquid volume: 1 μl (XPS measurement)

Apparatus: ULVAC Quantera SXM

Scanning X-ray Microscopy

Acceleration voltage: 3 kV

Emission current: 20 μA

TABLE 1

| ASHING RATE | CONTACT ANGLE | XPS (at %) | | |
|---|---|---|---|---|
| (nm/min) | OF WATER (°) | C1s | N1s | O1s |
| 76.6 | 40.9 | 72.0 | 14.0 | 12.9 |

TABLE 2

| ASHING RATE | CONTACT ANGLE | XPS (at %) | | | HYDROGEN |
|---|---|---|---|---|---|
| (nm/min) | OF WATER (°) | C1s | N1s | O1s | CONTENT (at %) |
| 82.5 | 71.1 | 88.9 | 0 | 10.4 | 24 |

Figure 13:
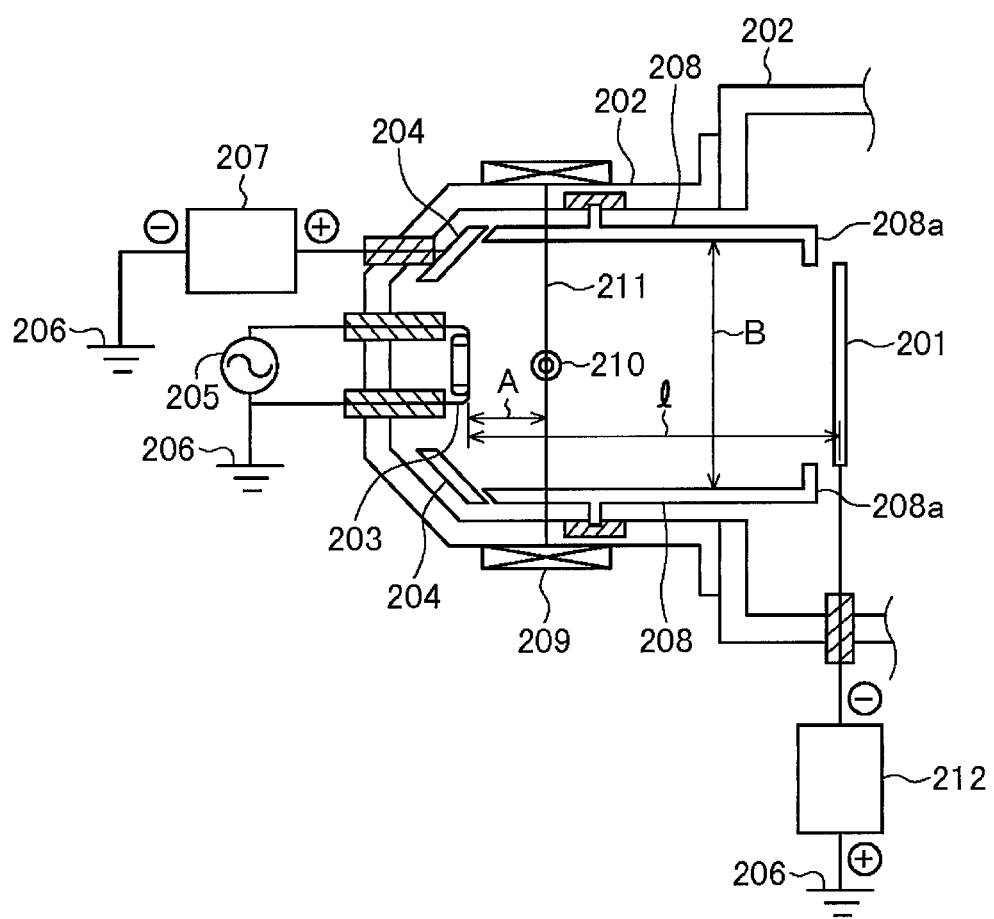
FIG. 13 is a cross-sectional view showing schematically a plasma CVD apparatus for depositing the $C_xN_yH_z$ film according to Example 2 and the DLC film according to Comparative Example.

FIG. 13 is a cross-sectional view showing schematically the plasma CVD apparatus for depositing the $C_xN_yH_z$ film in Example 2 and the DLC film in Comparative Example. The plasma CVD apparatus has a right-left symmetric structure relative to a substrate to be deposited (for example, disc substrate) and can perform deposition on both surfaces of a substrate to be deposited 201 at the same time, but in FIG. 13, the left-hand side relative to the substrate to be deposited 201 is shown and the right-hand side is omitted.

The plasma CVD apparatus has a chamber 202, and, in the chamber 202, a filament-like cathode electrode (hot cathode) 203 made of, for example, tantalum is formed. The both ends of the hot cathode 203 are electrically connected to an alternating-current power source 205 positioned outside the chamber 202, and the alternating-current power source 205 is disposed in a state of being insulated from the chamber 202. As the alternating-current power source 205, a power source of, for example, 0 to 50 V and 10 to 50 A (ampere) can be used. One end of the alternating-current power source 205 is electrically connected to an earth 206.

In the chamber 202, an anode electrode (horn anode) 204 having a funnel-like shape is disposed so as to surround the circumference of the hot cathode 203, and the horn anode 204 is set to have a speaker-like shape. The horn anode 204 is electrically connected to a DC power source (direct-current power source) 207, and the DC power source 207 is disposed in a state of being insulated from the chamber 202. The positive potential side of the DC power source 207 is electrically connected to the horn anode 204, and the negative potential side of the DC power source 207 is electrically connected to the earth 206. As the DC power source 207, a power source of, for example, 0 to 500 V and 0 to 7.5 A (ampere) can be used.

In the chamber 202, the substrate to be deposited 201 is disposed, and the substrate to be deposited 201 is disposed so as to face the hot cathode 203 and the horn anode 204. Particularly, the hot cathode 203 is surrounded by the horn anode 204 near the central portion of the inner circumferential surface thereof, and the horn anode 204 is disposed while directing the largest inside diameter side toward the substrate to be deposited 201.

The distance l between the hot cathode 203 and the substrate to be deposited 201 is preferably set as long as possible, and specifically, is preferably 200 nm or more and 300 mm or less. Because, when the distance l is set to be less than 200 mm, the hardness of a thin film deposited on the substrate to be deposited 201 becomes low, and, when the distance l is set to exceed 300 mm, the deposition rate becomes small and is impractical.

It is configured such that the substrate to be deposited 201 is fed sequentially to the illustrated position with a holder (holding portion) not illustrated, and a transfer device (handling robot or rotary index table) not illustrated.

The substrate to be deposited 201 is electrically connected to a DC power source (direct-current power source) 212 as a power source for accelerating ions, and the DC power source 212 is disposed in a state of being insulated from the chamber 202. The negative potential side of the DC power source 212 is electrically connected to the substrate to be deposited 201, and the positive potential side of the DC power source 212 is electrically connected to the earth 206. As the DC power source 212, a power source of, for example, 0 to 1500 V and 0 to 100 mA (milliampere) can be used.

In the chamber 202, a plasma wall 208 is disposed so as to cover the spaces between each of the hot cathode 203 and the horn anode 204, and the substrate to be deposited 201. The plasma wall 208 is electrically connected to a float potential (not illustrated), and is disposed in a state of being insulated from the chamber 202. In addition, the plasma wall 208 has a cylindrical shape or a polygonal shape, and the inside diameter B of the cylinder or the polygon is 100 mm or more and 200 mm or less. This is because when the inside diameter B is set to be less than 100 mm, the ionization degree of raw material gas becomes too high near the horn anode 204 and free carbon (that is, soot) tends to be generated easily, which is not preferable. Furthermore, when the inside diameter B is set to be more than 200 mm, the ionization degree of raw material gas becomes too low near the horn anode 204, and thus the deposition of a dense film on the substrate to be deposited 201 tends to become difficult and the formation of a high magnetic field tends to become difficult even when a neodymium magnet to be described later is used.

At the end part of the plasma wall 208 on the substrate to be deposited 201-side, a film thickness-correcting plate 208a is provided, and the film thickness-correcting plate 208a is electrically connected to the float potential. With the film thickness-correcting plate 208a, the thickness of a film to be deposited in the outer peripheral portion of the substrate to be deposited 201 can be controlled.

On the outside of the chamber 202, a neodymium magnet 209 is disposed. The neodymium magnet 209 has, for example, a cylindrical shape or a polygonal shape, and the distance A between the inside diameter 211 that passes at the center of the cylinder side face or the polygon side face in the tube direction and the hot cathode 203 is preferably within 50 mm (more preferably within 35 mm). The center of the inside diameter 211 corresponds to a magnet center 210, and the magnet center 210 is placed so as to face each of the approximate center of the hot cathode 203 and the approximate center of the substrate to be deposited 201. In the neodymium magnet 209, the magnetic force of the magnetic center 210 is preferably 50 G or more and 200 G (gauss) or less, more preferably 50 G or more and 150 G or less.

Furthermore, the plasma CVD apparatus has a vacuum evacuation mechanism (not illustrated) for evacuating the inside of the chamber 202. In addition, the plasma CVD apparatus also has a gas supply mechanism (not illustrated) for supplying a deposition raw material gas into the chamber 202.

Figure 14:
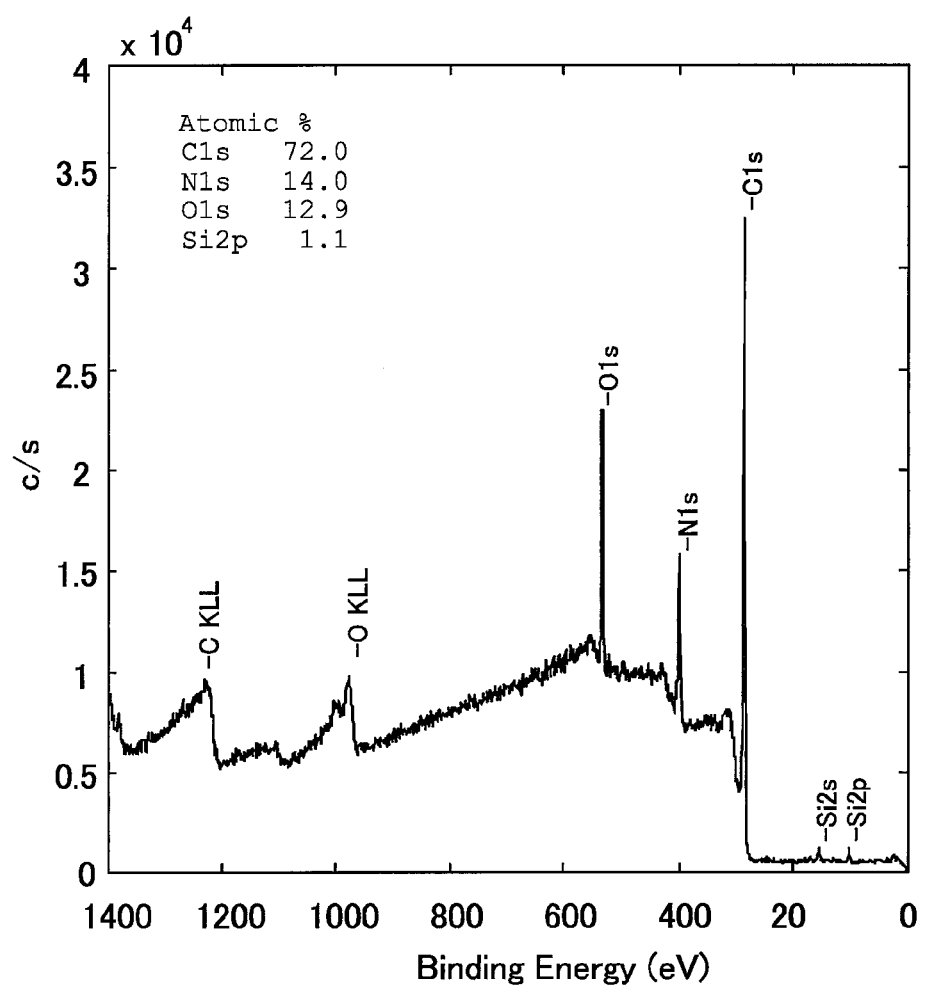
FIG. 14 is a drawing showing the result of surface analysis of the $C_xN_yH_z$ film in Example 2 by XPS.

FIG. 14 is a drawing showing the result of analyzing the surface of the $C_xN_yH_z$ film in Example 2 by XPS. In FIG. 14, the vertical axis shows intensity (c/s) and the horizontal axis shows a bonding energy (eV).

Figure 15:
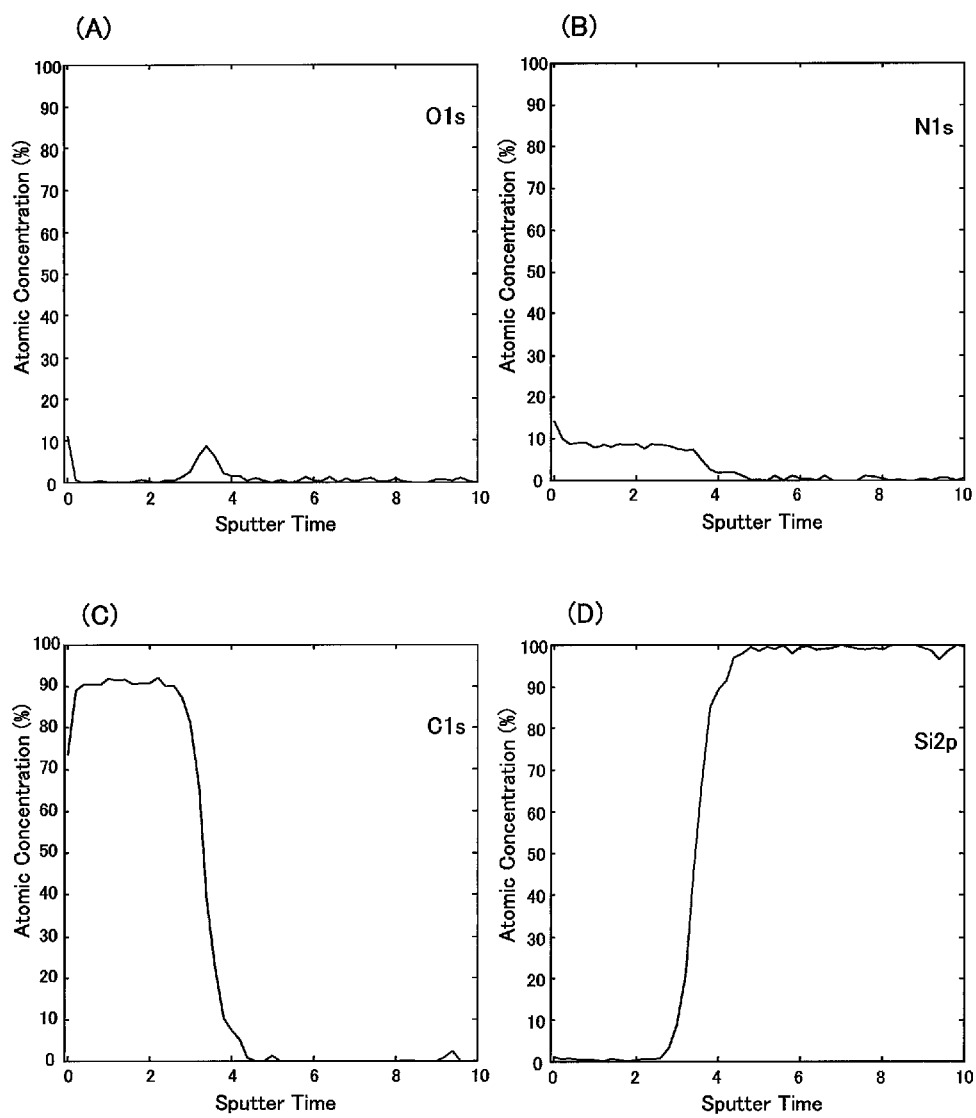
FIG. 15(A) is a drawing showing the result of analyzing O in the $C_xN_yH_z$ film.
FIG. 15(B) is a drawing showing the result of analyzing N in the $C_xN_yH_z$ film.
FIG. 15(C) is a drawing showing the result of analyzing C in the $C_xN_yH_z$ film.
FIG. 15(D) is a drawing showing the result of analyzing Si in the $C_xN_yH_z$ film.

FIGS. 15(A) to 15(D) are drawings showing the result of analyzing, by XPS, the $C_xN_yH_z$ film in Example 2 in the depth direction while sputtering the film. FIG. 15(A) shows the analysis result of O in the $C_xN_yH_z$ film, FIG. 15(B) shows the analysis result of N in the $C_xN_yH_z$ film, FIG. 15(C) shows the analysis result of C in the $C_xN_yH_z$ film, and FIG. 15(D) shows the analysis result of Si in the $C_xN_yH_z$ film. Meanwhile, in FIGS. 15(A) to 15(D), the vertical axis shows the content of atoms and the horizontal axis shows sputtering time.

Figure 16:
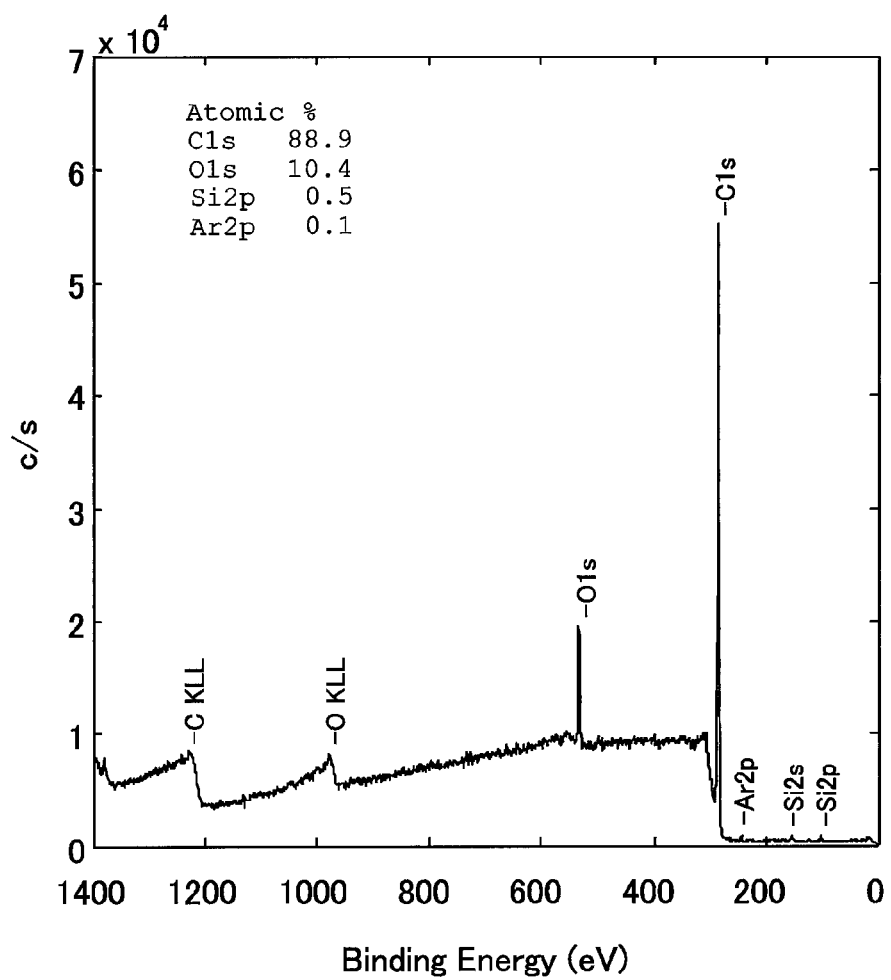
FIG. 16 is a drawing showing the result of surface analysis of the $C_xN_yH_z$ film in Comparative Example by XPS.

FIG. 16 is a drawing showing the result of analyzing, by XPS, the surface of the DLC film in Comparative Example. In FIG. 16, the vertical axis shows intensity (c/s) and the horizontal axis shows a bonding energy (eV).

Figure 17:
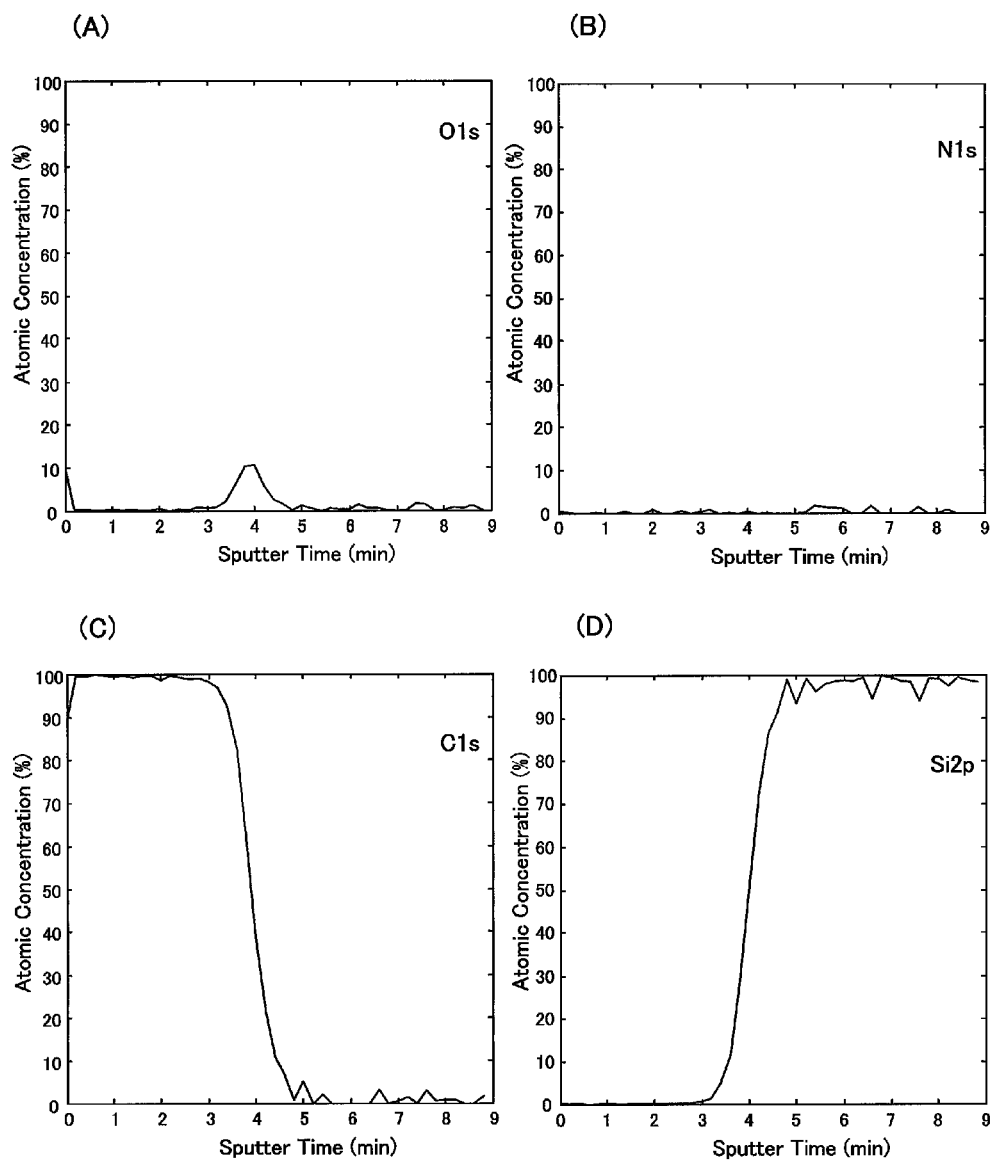
FIG. 17(A) is a drawing showing the result of analyzing O in the DLC film.
FIG. 17(B) is a drawing showing the result of analyzing N in the DLC film.
FIG. 17(C) is a drawing showing the result of analyzing C in the DLC film.
FIG. 17(D) is a drawing showing the result of analyzing Si in the DLC film.
Figure 18:
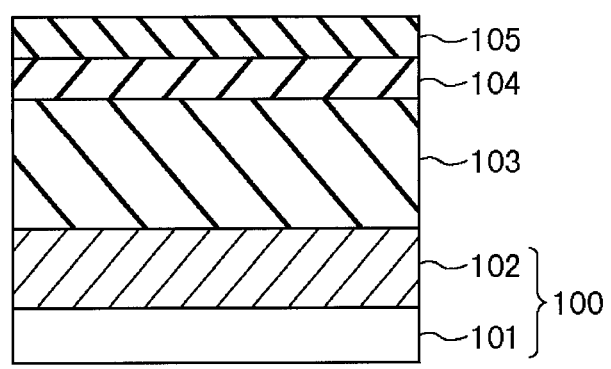
FIG. 18 is a cross-sectional view for explaining a method for manufacturing a conventional magnetic recording medium.

FIGS. 17(A) to 17(D) are drawings showing the result of analyzing, by XPS, the DLC film in Comparative Example in the depth direction while sputtering the film. FIG. 17(A) shows the analysis result of O in the DLC film, FIG. 17(B) shows the analysis result of N in the DLC film, FIG. 17(C) shows the analysis result of C in the DLC film, and FIG. 17(D) shows the analysis result of Si in the DLC film. Meanwhile, in FIGS. 17(A) to 17(D), the vertical axis shows the content of atoms and the horizontal axis shows sputtering time.

(Results of Experience)

As shown in Table 1 and Table 2, it was confirmed that an ashing rate of the $C_xN_yH_z$ film was approximately the same as that of the DLC film, and that the contact angle of water with the $C_xN_yH_z$ film was 50° or less.

DESCRIPTION OF THE SYMBOLS

1: chamber
2, 100: substrate to be deposited
3: supply mechanism of raw material gas
4: holding electrode
5: earth shield
6, 6a, 6b: high-frequency power source
7: gas shower electrode (counter electrode)
8a, 8b: changeover switch
11, 101: nonmagnetic substrate
12, 102: magnetic layer
13, 103: DLC film
14: $C_xN_yH_z$ film
15: any film of fluorinated organic film, $C_aF_b$ film, $C_aF_bN_c$ film, $C_aF_bH_d$ film, $C_aF_bO_e$ film, $C_aF_bO_eH_d$ film, $C_aF_bN_cO_e$ film and $C_aF_bN_cO_eH_d$ film
16: starting material
17: constant-temperature bath
18, 19: valve
20: mass flow controller
21, 21a: heater
22: needle valve
23a, 23b, 24: valve
25: liquid MFM
27: carburetor
28: supply piping
29, 30: valve
31: mass flow controller
104: CN film
105: fluorinated organic film

The invention claimed is:

1. A magnetic recording medium comprising:
a magnetic layer formed on a nonmagnetic substrate;
a $C_xN_yH_z$ film formed on said magnetic layer; and
a fluorinated organic film formed on said $C_xN_yH_z$ film,
wherein x, y and z satisfy formulae (1) to (4) below:

$$0.4 < x < 0.7 \tag{1}$$

$$0.01 < y < 0.5 \tag{2}$$

$$0 \leq z < 0.3 \tag{3}$$

$$x+y+z=1, \tag{4}$$

wherein said fluorinated organic film is a film selected from the group consisting of a $C_aF_b$ film, a $C_aF_bN_c$ film, a $C_aF_bH_d$ film, a $C_aF_bN_cO_e$ film and a $C_aF_bN_cO_eH_d$ film, and
where a, b, c, d and e are natural numbers excluding zero.

2. The magnetic recording medium according to claim 1, wherein said $C_xN_yH_z$ film has a surface with which the contact angle of water is 50° or less.

3. The magnetic recording medium according to claim 1, further comprising a DLC film formed between said $C_xN_yH_z$ film and said magnetic layer.

4. The magnetic recording medium according to claim 1, wherein said fluorinated organic film is an amorphous film.

5. The magnetic recording medium according to claim 1, wherein each of said films has a thickness of 3 nm or less.

6. A deposition method of a $C_xN_yH_z$ film on a substrate to be deposited, comprising forming the $C_xN_yH_z$ film on the substrate by a CVD method using a gas of a vaporized starting material,
wherein said starting material is a liquid or a solid at ordinary temperature,
wherein x, y and z satisfy formulae (1) to (4) below:

$$0.4 < x < 0.7 \tag{1}$$

$$0.01 < y < 0.5 \tag{2}$$

$$0 < z < 0.3 \tag{3}$$

$$x+y+z=1, \text{ and} \tag{4}$$

wherein said starting material is a raw material selected from the group consisting of $C_4H_2N_2$, $C_5H_3N_3$, $C_7H_3N_3$, $C_6H_2N_4$, $C_5H_2N_4$, $C_{10}H_2N_4$ and $C_{12}H_4N_4$.

7. A method for manufacturing a magnetic recording medium, comprising forming a fluorinated organic film on a $C_xN_yH_z$ film deposited by the deposition method according to claim 6,
  wherein said substrate to be deposited has a magnetic layer formed on a nonmagnetic substrate; and
  wherein said $C_xN_yH_z$ film has a surface with which the contact angle of water is 50° or less.

8. The method for manufacturing a magnetic recording medium according to claim 7,
  wherein a DLC film is formed between said $C_xN_yH_z$ film and said magnetic layer.

9. The method for manufacturing a magnetic recording medium according to claim 7,
  wherein said fluorinated organic film is any film of a $C_aF_b$ film, a $C_aF_bN_c$ film, a $C_aF_bH_d$ film, a $C_aF_bO_e$ film, a $C_aF_bO_eH_d$ film, a $C_aF_bN_cO_e$ film and a $C_aF_bN_cO_eH_d$ film formed by a CVD method using a raw material gas;
  wherein said raw material gas has an organic raw material gas containing carbon and fluorine, and
  where a, b, c, d and e are natural numbers.

10. The method for manufacturing a magnetic recording medium according to claim 9,
  wherein said organic raw material gas contains three or more carbons.

11. The method for manufacturing a magnetic recording medium according to claim 9,
  wherein said organic raw material gas when forming said $C_aF_b$ film on said $C_xN_yH_z$ film has at least one of $C_3F_6$, $C_4F_6$, $C_6F_6$, $C_6F_{12}$, $C_6F_{14}$, $C_7F_8$, $C_7F_{14}$, $C_7F_{16}$, $C_8F_{16}$, $C_8F_{18}$, $C_9F_{18}$, $C_9F_{20}$, $C_{10}F_8$, $C_{10}F_{18}$, $C_{11}F_{20}$, $C_{12}F_{10}$, $C_{13}F_{28}$, $C_{15}F_{32}$, $C_{20}F_{42}$, and $C_{24}F_{50}$;
  wherein said organic raw material gas when forming said $C_aF_bN_c$ film on said $C_xN_yH_z$ film has at least one of $C_3F_3N_3$, $C_3F_9N$, $C_5F_5N$, $C_6F_4N_2$, $C_6F_9N_3$, $C_6F_{12}N_2$, $C_6F_{15}N$, $C_7F_5N$, $C_8F_4N_2$, $C_9F_{21}N$, $C_{12}F_4N_4$, $C_{12}F_{27}N$, $C_{14}F_8N_2$, $C_{15}F_{33}N$, $C_{24}F_{45}N_3$, and tri(heptafluoropropyl)amine;
  wherein said organic raw material gas when forming said $C_aF_bO_d$ film on said $C_xN_yH_z$ film has at least one of $C_3F_6O$, $C_4F_6O_3$, $C_4F_8O$, $C_5F_6O_3$, $C_6F_4O_2$, $C_6F_{10}O_3$, $C_8F_4O_3$, $C_8F_8O$, $C_8F_8O_2$, $C_8F_{14}O_3$, $C_{13}F_{10}O$, $C_{13}F_{10}O_3$, and $C_2F_6O(C_3F_6O)_n(CF_2O)_m$; and
  wherein said organic raw material gas when forming said $C_aF_bN_cO_d$ film on said $C_xN_yH_z$ film has $C_7F_5NO$.

12. The method for manufacturing a magnetic recording medium according to claim 9,
  wherein perfluoroamines are used as said organic raw material gas.

13. The method for manufacturing a magnetic recording medium according to claim 9,
  wherein the CVD method using said raw material gas is a plasma CVD method of holding said $C_xN_yH_z$ film by a holding electrode, disposing a counter electrode facing said $C_xN_yH_z$ film held by said holding electrode, and setting, to be +150 V to −150 V, a direct-current voltage in forming direct-current plasma or a direct-current voltage component in forming high-frequency plasma, by supplying electric power to one of said holding electrode and said counter electrode.

14. A method for manufacturing a magnetic recording medium comprising:
  forming a $C_xN_yH_z$ film on a substrate to be deposited, by a CVD method using a gas of a vaporized starting material; and
  forming a fluorinated organic film on said $C_xN_yH_z$ film,
  wherein said substrate to be deposited has a magnetic layer formed on a nonmagnetic substrate;
  wherein said $C_xN_yH_z$ film has a surface with which the contact angle of water is 50° or less,
  wherein x, y and z satisfy formulae (1) to (4) below:

$$0.4<x<0.7 \tag{1}$$

$$0.01<y<0.5 \tag{2}$$

$$0<z<0.3 \tag{3}$$

$$x+y+z=1, \tag{4}$$

wherein said starting material contains $C_{X'}N_{Y'}H_{Z'}$ and is a liquid or a solid at ordinary temperature, and wherein X', Y' and Z' are natural numbers and satisfy formulae (5) to (8) below, $$4 \leq X' \leq 12 \tag{5}$$

$$0 \leq Y' \leq 4 \tag{6}$$

$$2 \leq Z' \leq 12 \tag{7}$$

$$Y'/X'<1. \tag{8}$$

15. The method for manufacturing a magnetic recording medium according to claim 14,
  wherein said starting material is a raw material selected from the group consisting of $C_4H_2N_2$, $C_5H_3N_3$, $C_7H_3N_3$, $C_6H_2N_4$, $C_5H_2N_4$, $C_{10}H_2N_4$, $C_{12}H_4N_4$ and $C_6N_4$.

16. The method for manufacturing a magnetic recording medium according to claim 14,
  wherein a DLC film is formed between said $C_xN_yH_z$ film and said magnetic layer.

17. The method for manufacturing a magnetic recording medium according to claim 14,
  wherein said fluorinated organic film is selected from the group consisting of a $C_aF_b$ film, a $C_aF_bN_c$ film, a $C_aF_bH_d$ film, a $C_aF_bO_e$ film, a $C_aF_bO_eH_d$ film, a $C_aF_bN_cO_e$ film and a $C_aF_bN_cO_eH_d$ film formed by a CVD method using a raw material gas;
  wherein said raw material gas has an organic raw material gas containing carbon and fluorine, and
  wherein a, b, c, d and e are natural numbers.

* * * * *